United States Patent
Choi et al.

(10) Patent No.: US 12,238,925 B2
(45) Date of Patent: Feb. 25, 2025

(54) SEMICONDUCTOR MEMORY DEVICE CAPABLE OF EXPANDING BANK CAPACITY ADAPTIVELY TO PACKAGE SIZE AND METHOD OF DESIGNING THE SAME

(71) Applicant: Samsung Electronics Co., Ltd., Suwon-si (KR)

(72) Inventors: Ik-Joon Choi, Suwon-si (KR); Kihyun Kim, Suwon-si (KR); Sungchul Park, Suwon-si (KR); Minjun Kim, Suwon-si (KR); Junhyung Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 159 days.

(21) Appl. No.: 18/143,756

(22) Filed: May 5, 2023

(65) Prior Publication Data

US 2024/0057324 A1   Feb. 15, 2024

(30) Foreign Application Priority Data

Aug. 11, 2022  (KR) .................. 10-2022-0100892
Oct. 24, 2022  (KR) .................. 10-2022-0137303

(51) Int. Cl.
*H10B 12/00*   (2023.01)
*G11C 11/408*   (2006.01)

(52) U.S. Cl.
CPC .......... *H10B 12/50* (2023.02); *G11C 11/4087* (2013.01)

(58) Field of Classification Search
CPC ..... H10B 12/50; G11C 11/4087; G11C 5/025; G11C 8/10
USPC .................................................. 365/230.06
See application file for complete search history.

(56) References Cited

U.S. PATENT DOCUMENTS

| | | | |
|---|---|---|---|
| 7,031,188 B2 | 4/2006 | Lee et al. | |
| 7,130,209 B2 | 10/2006 | Reggiori et al. | |
| 7,161,380 B2 | 1/2007 | Hsu | |
| 7,394,689 B2 | 7/2008 | Ryu | |
| 8,120,985 B2 * | 2/2012 | Kunce | G11C 8/12 365/230.03 |
| 8,755,230 B2 | 6/2014 | Shinagawa | |
| 2010/0220517 A1 | 9/2010 | Okayama | |
| 2018/0315457 A1 * | 11/2018 | Nishizaki | G11C 29/00 |
| 2019/0214057 A1 * | 7/2019 | Won | G11C 5/025 |
| 2019/0214066 A1 * | 7/2019 | Nakaoka | G11C 11/4091 |

(Continued)

FOREIGN PATENT DOCUMENTS

| | | | | |
|---|---|---|---|---|
| CN | 113495694 A | * | 10/2021 | ............ G06N 3/04 |
| JP | 1145233 | | 2/1999 | |
| JP | 2007122796 A | | 5/2007 | |

(Continued)

OTHER PUBLICATIONS

Symes et al. (Year: 2021).*

*Primary Examiner* — Fernando Hidalgo
(74) *Attorney, Agent, or Firm* — Myers Bigel, P.A.

(57) ABSTRACT

A semiconductor memory device includes n physical banks, each of which is configured to be entirely or partially included in one of a first logic bank or a second logic bank and arranged in a row direction, wherein n is an integer that is greater than or equal to 3, and wherein a proportion of a sum of respective widths of the n physical banks in the row direction to a height of the n physical banks in a column direction is a real number multiple that is not a multiple of 2.

20 Claims, 18 Drawing Sheets

(56) References Cited

U.S. PATENT DOCUMENTS

2022/0254395 A1* 8/2022 Kang ................ G11C 7/06

FOREIGN PATENT DOCUMENTS

| JP | 5549091 B2 | 5/2014 |
| KR | 20050046520 A | 5/2005 |
| KR | 20060083336 A | 7/2006 |
| KR | 20120061561 A | 6/2012 |
| KR | 20140083242 A | 7/2014 |
| KR | 20200087393 A | 7/2020 |

* cited by examiner

SEMICONDUCTOR MEMORY DEVICE CAPABLE OF EXPANDING BANK CAPACITY ADAPTIVELY TO PACKAGE SIZE AND METHOD OF DESIGNING THE SAME

CROSS-REFERENCE TO RELATED PATENT APPLICATION(S)

This application claims priority under 35 U.S.C. § 119 to Korean Patent Application No. 10-2022-0100892 filed on Aug. 11, 2022, and Korean Patent Application No. 10-2022-0137303 filed on Oct. 24, 2022, in the Korean Intellectual Property Office, the disclosures of which are incorporated by reference herein in their entireties.

BACKGROUND

The present disclosure relates to a semiconductor memory device, and more particularly, to a semiconductor memory device in which a capacity of a bank may be expanded adaptively to a size of a package and a method of designing the same.

In recent years, a storage capacity for a semiconductor memory device has continuously increased. In this regard, various research and development has been made to increase a storage capacity of a semiconductor memory device. For example, a method of increasing the number of memory cells integrated on a same area has been suggested in such a way that the size of memory cells is reduced or semiconductor memory chips are stacked. Also, a method of expanding an area which enables memory cells to be integrated has been suggested in such a way that an area used for a peripheral circuit is reduced.

However, in increasing a storage capacity of a semiconductor memory device, there may be restrictions such as a standardized size of a package and a standardized operating condition.

SUMMARY

The present disclosure provides a semiconductor memory device, in which a capacity of a bank may be expanded adaptively to a size of a package while operating condition(s) required for the semiconductor memory device are satisfied, and a method of designing the same.

According to aspects of the present disclosure, a semiconductor memory device includes n physical banks, each of which is configured to be entirely or partially included in one of a first logic bank or a second logic bank and arranged in a row direction, wherein n is an integer that is greater than or equal to 3, and wherein a proportion of a sum of respective widths of the n physical banks in the row direction to a height of the n physical banks in a column direction is a real number multiple that is not a multiple of 2.

According to aspects of the present disclosure, a method of designing a semiconductor memory device includes: adjusting a first width of first and second physical banks to a second width, respectively, and a first height of the first and second physical banks to a second height, respectively, the first and second physical banks being adjacent to each other in a row direction; providing at least one other physical bank in the row direction having the second width and the second height; and adjusting at least one of the second width or the second height such that a proportion of a sum of the second width of the first physical bank, the second physical bank, and the other physical bank to the second height is a real number multiple that is not a multiple of 2, thereby increasing a sum of a capacity of the first and second physical banks by a multiple 2.

According to aspects of the present disclosure, a semiconductor memory device includes: p physical banks that each include at least two sub-banks; p column decoders each electrically connected to a corresponding physical bank from the p physical banks through a global input and output line, wherein a number of the p column decoders is equal to a number of the p physical banks; and q row decoders each configured to activate one or more word lines of a corresponding logic bank from q logic banks, wherein each of the p physical banks is configured to be entirely or partially included in one of the q logic banks, and wherein p is a positive integer that is odd, and q is a positive integer that is greater than or equal to 2 but less than p.

BRIEF DESCRIPTION OF THE DRAWINGS

The above and other features and advantages of the present disclosure will become more apparent by describing in detail example embodiments thereof with reference to the attached drawings in which.

DETAILED DESCRIPTION

Hereinafter, example embodiments of the present disclosure will be described in detail with reference to the accompany drawings.

Figure 1A:
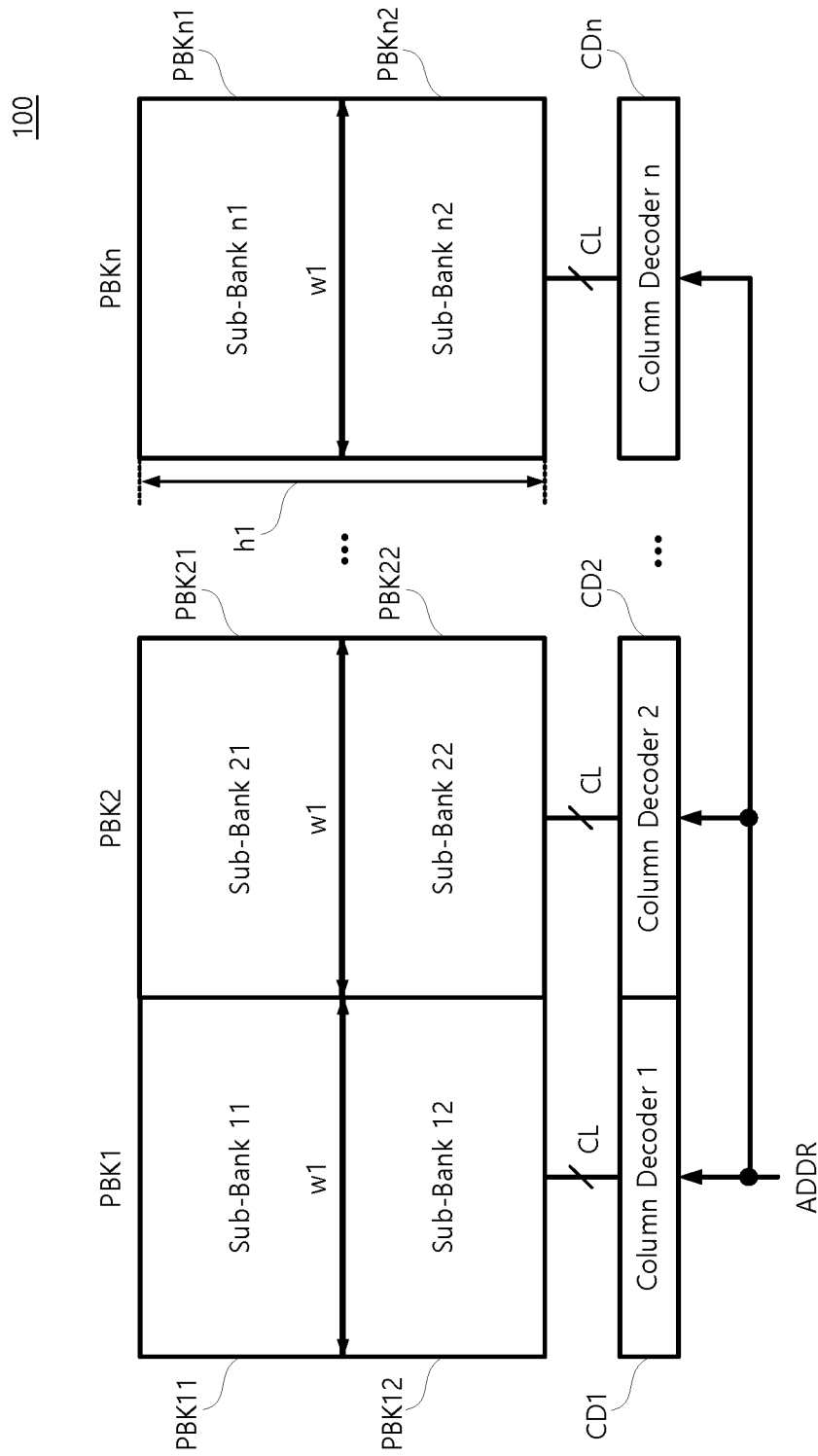
FIGS. 1A and 1B respectively illustrate a semiconductor memory device according to some embodiments of the present disclosure.
Figure 1B:
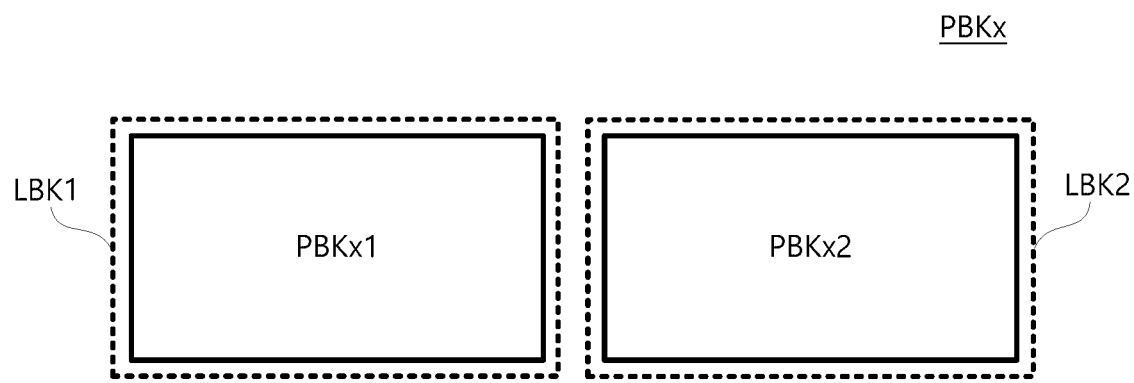

FIGS. 1A and 1B respectively illustrate a semiconductor memory device 100 according to some embodiments of the present disclosure.

Referring to FIGS. 1A and 1B, the semiconductor memory device 100 according to some embodiments of the present disclosure includes n (n is an integer of 3 or above) physical banks PBK1 through PBKn. For example, n may be an integer that is greater than or equal to 3. A first physical bank PBK1 through a nth physical bank PBKn may each have a first width w1 and a first height h1. Here, the first height h1 of the first physical bank PBK1 through the nth physical bank PBKn may correspond to the number of included word lines and the first width w1 of the first physical bank PBK1 through the nth physical bank PBKn may correspond to a size of included pages. The first physical bank PBK1 through the nth physical bank PBKn may be disposed in a row direction. The semiconductor memory device 100 according to some embodiments of the present disclosure may be a Dynamic Random Access Memory (DRAM).

The first physical bank PBK1 through the nth physical bank PBKn according to some embodiments of the present disclosure may respectively include each of column decoders CD1 through CDn. A column line CL that corresponds to an address ADDR may be activated through the column decoders CD1 through CDn. The address ADDR may be transmitted from the outside of (e.g., external to) the semiconductor memory device 100 along with a write command, a read command, and/or a precharge command. The address ADDR may include a bank address, a column address, and a row address which specifies a memory cell to be written, read, or precharged.

For example, a first column line CL of the first physical bank PBK1 that corresponds to the address ADDR may be activated through a first column decoder CD1. Similarly, a second column decoder CD2 through the nth column decoder CDn may activate the column lines CL of a second physical bank PBK2 through the nth physical bank PBKn that correspond to the address ADDR.

The first physical bank PBK1 through the nth physical bank PBKn may each include at least two sub-banks. For example, the first physical bank PBK1 may include a (1-1)-th sub-bank PBK11 and a (1-2)-th sub-bank PBK12, the second physical bank PBK2 may include a (2-1)-th sub-bank PBK21 and a (2-2)-th sub-bank PBK22, and the nth physical bank PBKn may include a (n–1)-th sub-bank PBKn1 and a (n–2)-th sub-bank PBKn2.

The first physical bank PBK1 through the nth physical bank PBKn may be operated after being regrouped to a first logic bank LBK1 and a second logic bank LBK2. That is, each of the first physical bank PBK1 through the nth physical bank PBKn may be entirely or partially included in one of the first logic bank LBK1 or the second logic bank LBK2. For example, a part of the first physical bank PBK1 through the nth physical bank PBKn may be included in the first logic bank LBK1 and the rest may be included in the second logic bank LBK2. Also, in case of an Xth bank PBKx which is an arbitrary physical bank from the first physical bank PBK1 through the nth physical bank PBKn, a x1th sub-bank PBKx1 may be included in the first logic bank LBK1 and a x2th sub-bank PBKx2 may be included in the second logic bank LBK2.

When the physical banks PBK1 through PBKn are classified as units each including its own column decoder CD1 through CDn, the logic banks LBK1 and LBK2 may be defined as units that may operate independently of each other. For example, access to a memory cell included in the first logic bank LBK1 and access to a memory cell included in the second logic bank LBK2 may be simultaneously available for write, read, or pre-charge operation.

Here, each of the first physical bank PBK1 through the nth physical bank PBKn may be entirely or partially activated in response to activation of the logic banks LBK1 and LBK2 including the entire or a part of the first physical bank PBK1 through the nth physical bank PBKn. For example, the x1th sub-bank PBKx1 of the Xth bank PBKx may be activated when the first logic bank LBK1 is activated, and the x2th sub-bank PBKx2 may be activated when the second logic bank LBK2 is activated.

That is, regardless of the number of the physical banks PBK1 through PBKn, the semiconductor memory device 100 may be operated according to the number of the logic banks LBK1 and LBK2. Accordingly, while in correcting design for a capacity of the physical banks PBK1 through PBKn in order to increase a capacity required for the semiconductor memory device 100, restriction on a change in the number of the physical banks PBK1 through PBKn may be relaxed.

For example, as illustrated in FIGS. 1A and 1B, the semiconductor memory device 100 having a 2-bank structure according to some embodiments of the present disclosure may not have the physical banks PBK1 through PBKn as multiples of 2. In the semiconductor memory device 100 according to some embodiments of the present disclosure, the number of the physical banks PBK1 through PBKn may be an odd number such as 3 or 5. However, the present disclosure is not limited thereto and the number of the physical banks PBK1 through PBKn may be an odd number that is greater than 3 or 5. Although the physical banks PBK1 through PBKn are odd numbers, the physical banks PBK1 through PBKn may be included in one of two logic banks LBK1 and LBK2 and may be operated in each unit of the logic bank LBK1 or the logic bank LBK2 so as to correspond to a standard for operation of the semiconductor memory device 100.

Here, the 2-bank structure may denote that one row decoder is shared by two banks. A row decoder of the semiconductor memory device 100 according to some embodiments of the present disclosure will be described later.

Along with the restriction on the number of the physical banks PBK1 through PBKn, there may be restriction on packaging of the semiconductor memory device 100 in order to increase a size of the physical banks PBK1 through PBKn to correspond to an increase of a capacity required for the semiconductor memory device 100.

Figure 2A:
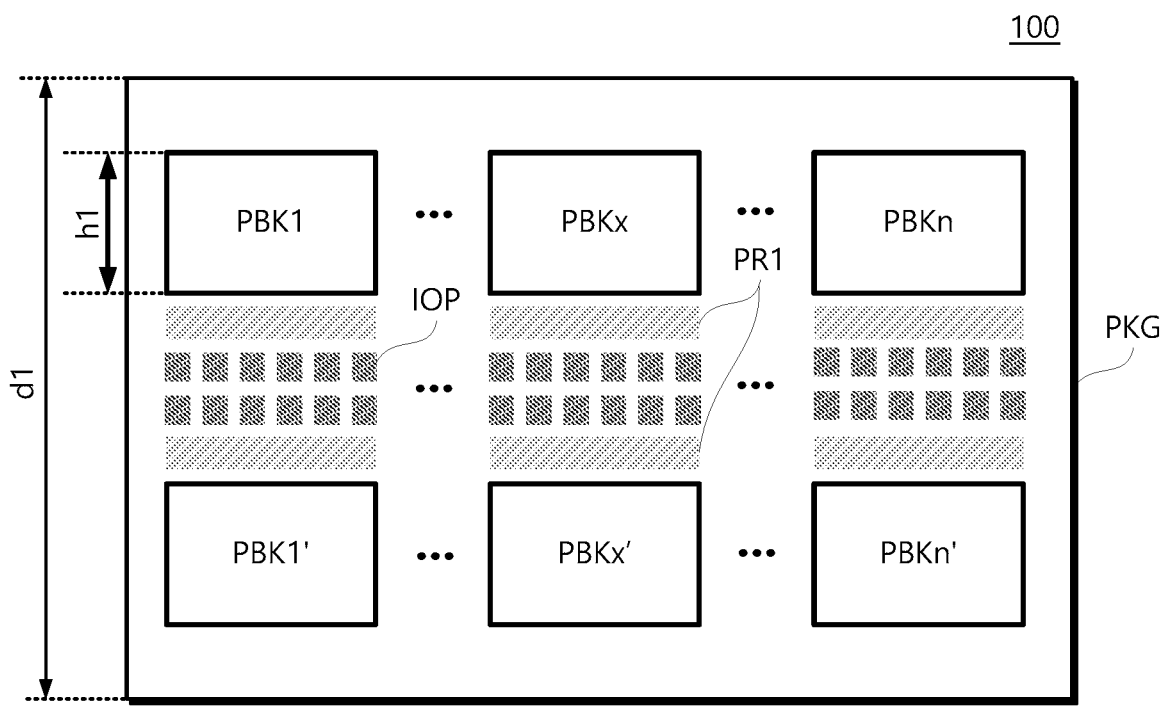
FIGS. 2A and 2B illustrate packaging restrictions of a semiconductor memory device with respect to a size increase of physical banks.
Figure 2B:
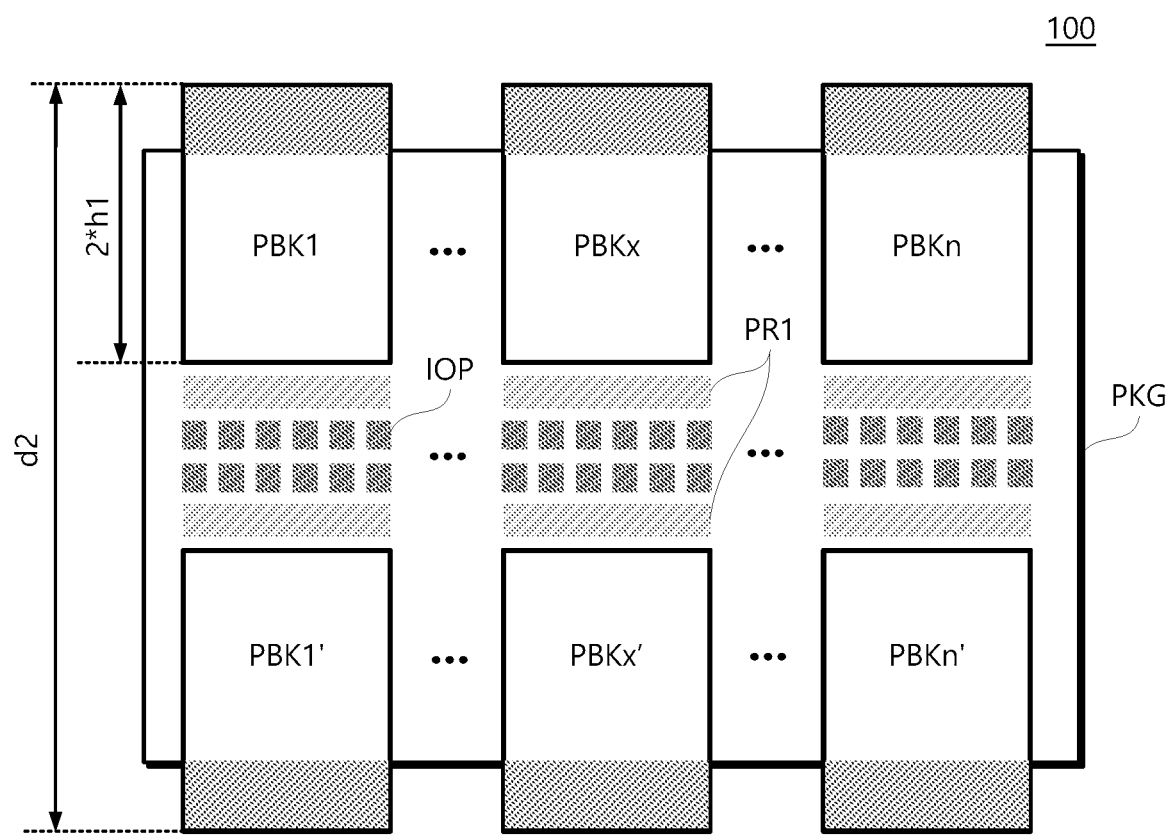

FIGS. 2A and 2B illustrate packaging restrictions of the semiconductor memory device 100 with respect to a size increase in each of the physical banks PBK1 through PBKn. For convenience of description, a package PKG illustrated in FIGS. 2A and 2B includes components needed only to explain the restrictions with respect to a size increase in each of the physical banks due to packaging conditions.

Referring to FIGS. 2A and 2B, when, for example, a capacity of the semiconductor memory device 100 is to double, a capacity of each of the physical banks PBK1 through PBKn and PBK1' through PBKn' may be doubled. If it is assumed that two physical banks are paired like the physical banks PBKx and PBKx' and are disposed to be adjacent to each other in a first direction (for example, a column direction) of the package PKG, the first height h1 of each of the physical banks PBK1 through PBKn and PBK1' through PBKn', that is, the number of row addresses, may be doubled from 64 to 128, in order to double the capacity of the semiconductor memory device 100.

When the row address of each of the physical banks PBK1 through PBKn and PBK1' through PBKn' is doubled, the semiconductor memory device 100 may not satisfy its packaging standard. For example, the distance d2 in a column direction obtained by adding an increased height 2*h1 of each pair of the physical banks PBKx and PBKx', which are disposed to be adjacent to each other in a column direction, to the length of areas including first peripheral circuit regions PR1 and input and output pads IOPs, which are arranged for the corresponding physical banks PBKx and PBKx', may be greater than the distance d1 in a column direction of the package PKG. The first peripheral circuit regions PR1 may include the column decoders (CD1 through CDn of FIG. 1), a global input and output sense amplifier (not illustrated), an input and output driver (not illustrated), and/or an input and output buffer (not illustrated).

FIGS. 2A and 2B illustrate the space between the pair of the physical banks PBKx and PBKx', that is, the input and output pad IOP disposed at the center of the package PKG. However, the present disclosure is not limited thereto and the input and output pad IOP may be disposed to be adjacent to the entire part or a part of the outer side of the package PKG.

When the semiconductor memory device 100 according to some embodiments of the present disclosure is packaged as in FIG. 2A or FIG. 2B, the semiconductor memory device 100 may be designated as a semiconductor memory chip. In addition, the semiconductor memory device 100 according to some embodiments of the present disclosure may be designated as a partial component included in a semiconductor memory chip or may be in various types such as a semiconductor memory module including a plurality of semiconductor memory chips.

Figure 3:
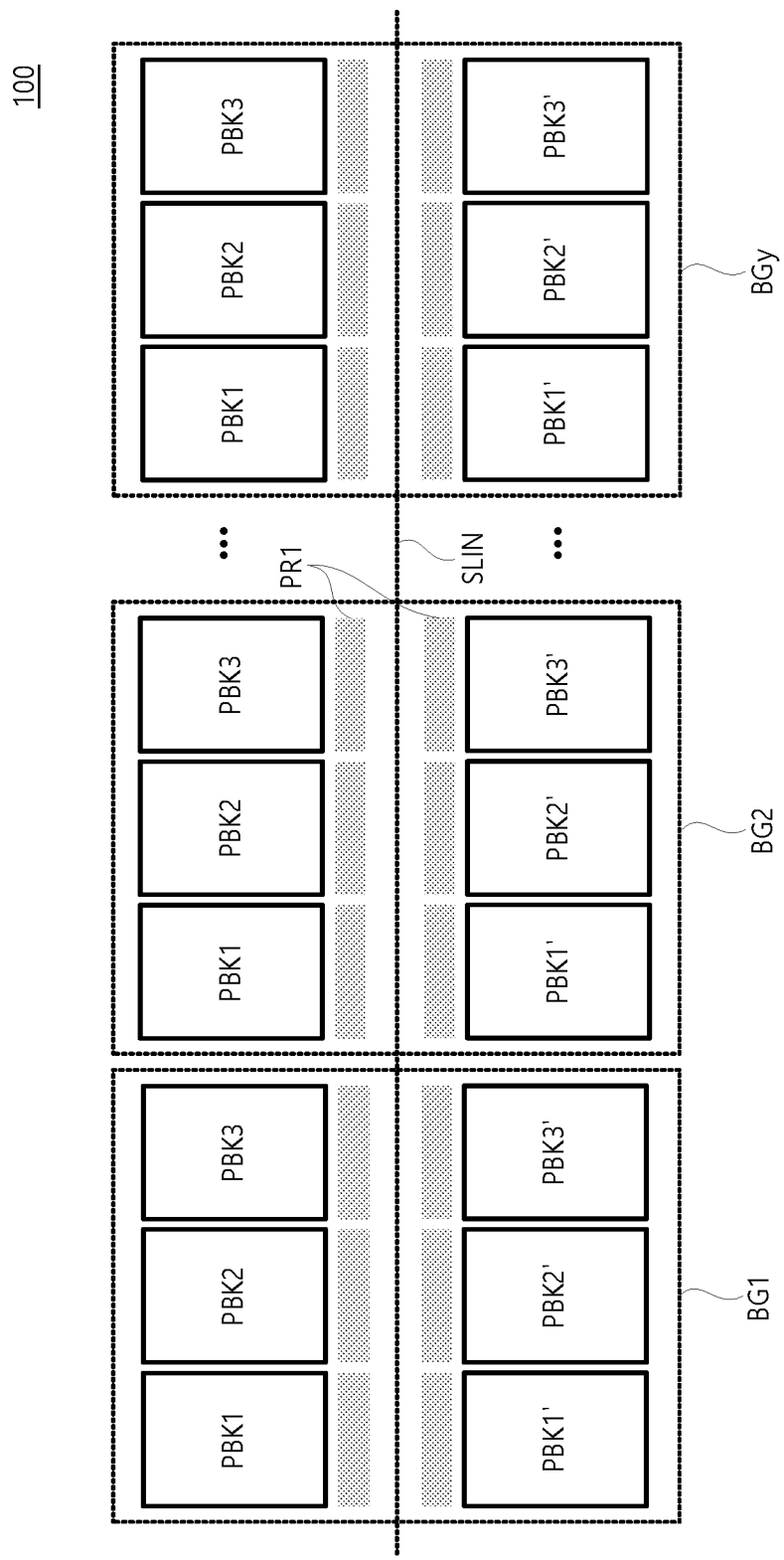
FIG. 3 illustrates bank groups according to some embodiments of the present disclosure.
Figure 4:
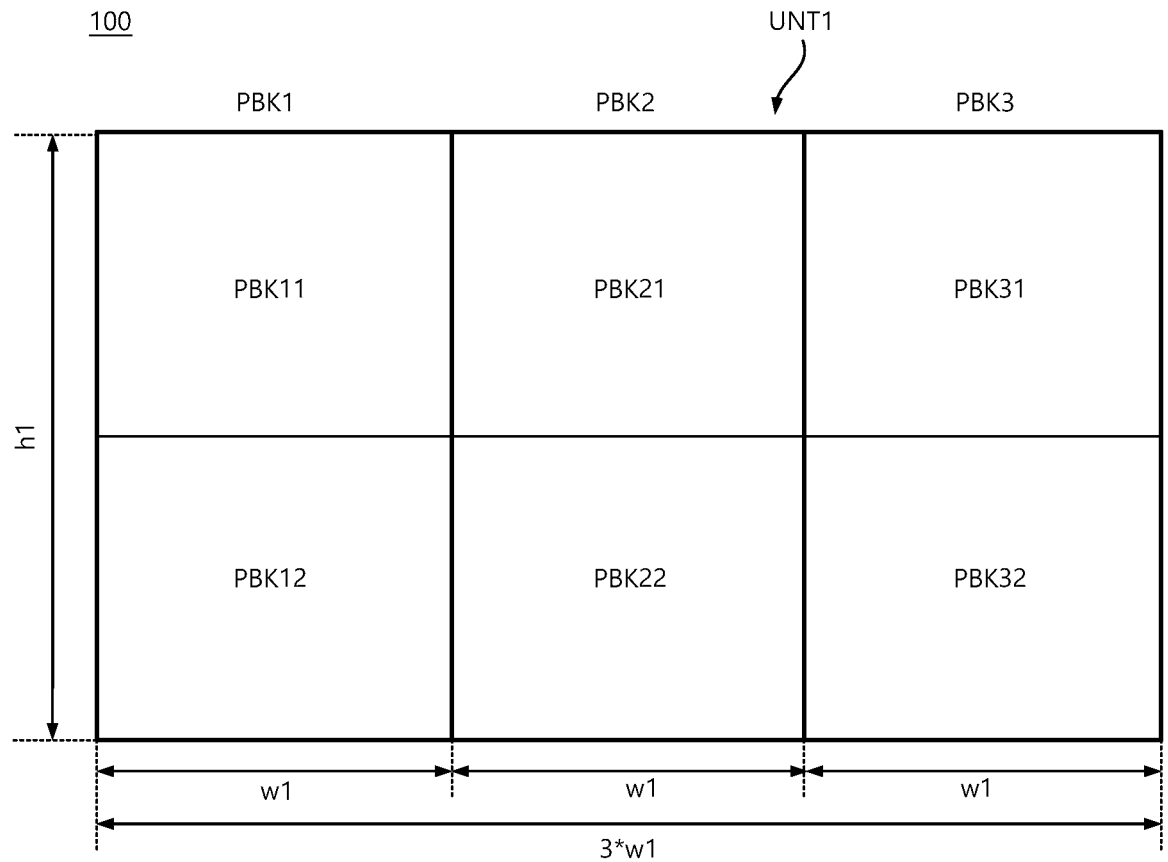
FIG. 4 illustrates physical banks in a smallest repeating unit included in bank groups according to some embodiments of the present disclosure.

FIG. 3 illustrates bank groups BG1 through BGy according to some embodiments of the present disclosure, and FIG. 4 illustrates the physical banks PBK1 through PBK3 in a smallest repeating unit included in the bank groups BG1 through BGy according to some embodiments of the present disclosure.

Referring to FIGS. 3 and 4, the semiconductor memory device 100 according to some embodiments of the present disclosure may include y (y is an integer of 2 or above) bank groups BG1 through BGy. For example, y may be an integer that is greater than or equal to 2. The first bank group BG1 through the yth bank group BGy may each include a plurality of first unit structures UNT1 which are adjacent to each other in a row direction. The first unit structure UNT1 may denote a structure in a smallest repeating unit in each of the first bank group BG1 through the yth bank group BGy.

In FIGS. 3 and 4, the first unit structure UNT1 includes 3 physical banks, that is the first physical bank PBK1 through the third physical bank PBK3 and the first bank group BG1 through the yth bank group BGy each include 2 first unit structures UNT1. That is, the first bank group BG1 through the yth bank group BGy may each include the first physical bank PBK1 through the third physical bank PBK3 and first-prime physical bank PBK1' through third-prime physical bank PBK3'. The first-prime physical bank PBK1' through third-prime physical bank PBK3' may also be considered a second set of the first physical bank PBK1 through the third physical bank PBK3. For example, the first bank group BG1 through the yth bank group BGy may each include a pair of the physical banks PBK1 through PBKn (e.g., the first physical bank PBK1 through the third physical bank PBK3 and the first-prime physical bank PBK1' through third-prime physical bank PBK3').

The first physical bank PBK1 through the third physical bank PBK3 and the first-prime physical bank PBK1' through the third-prime physical bank PBK3' may be symmetric with each other about a symmetrical line SLIN which is extended in a row direction. In this regard, the first peripheral circuit regions PR1 of the first physical bank PBK1 through the third physical bank PBK3 and the first-prime physical bank PBK1' through the third-prime physical bank PBK3' may be adjacent to each other in a column direction. For example, a pair of the physical banks PBK1 through PBKn (e.g., the first physical bank PBK1 through the third physical bank PBK3 and the first-prime physical bank PBK1' through the third-prime physical bank PBK3') may be symmetric with each other about a symmetrical line SLIN that extends between respective first peripheral circuit regions PR1 of the pair of physical banks PBK1 through PBKn (e.g., the first peripheral circuit regions PR1 of the first physical bank PBK1 through the third physical bank PBK3 and the first-prime physical bank PBK1' through the third-prime physical bank PBK3'). The respective first peripheral circuit regions PR1 may be adjacent to each other in a column direction. In this case, an average wire length between each of the first peripheral circuit regions PR1 and the input and output pads IOP (in FIG. 2A) may be shortened in the semiconductor memory device 100 according to some embodiments of the present disclosure.

The size of the physical banks PBK1 through PBK3 included in the first unit structure UNT1 according to some embodiments of the present disclosure may not be a multiple of 2. For example, the proportion of the first height h1 of each of the first physical bank PBK1 through the third physical bank PBK3 included in the first unit structure UNT1 to the sum 3*w1 of the first widths w1 of each of the first physical bank PBK1 through the third physical bank PBK3 may be a real number multiple except a multiple of 2. For example, the proportion of the sum 3*w1 of respective first widths w1 of the first physical bank PBK1, the second physical bank PBK2, and the third physical bank PBK3 in a row direction to the first height h1 of the first physical bank PBK1, the second physical bank PBK2, and the third physical bank PBK3 in a column direction may be a real number multiple that is not a multiple of 2. For example, the proportion of the first height h1 of each of the first physical bank PBK1 through the third physical bank PBK3 to the sum 3*w1 of the first widths w1 of each of the first physical bank PBK1 through the third physical bank PBK3 may be 1.5:1.3.

Compared with other semiconductor memory devices having a 2-bank structure which includes 2 physical banks, each of which has 64 row addresses and a page size of 8 Kbit, the capacity of the semiconductor memory device 100 according to some embodiments of the present disclosure, in which the proportion of the first height h1 to the sum 3*w1 of the first widths w1 with respect to 3 physical banks PBK1 through PBK3 is 1.5:1.3, increases twice.

In this case, the semiconductor memory device 100 according to some embodiments of the present disclosure may satisfy the standard of the package PKG of FIG. 2A or FIG. 2B and may have the capacity required for the semiconductor memory device 100. As described above, the first physical bank PBK1 through the third physical bank PBK3 may have the same size (e.g., a same height and width). Also, the first height h1 of the physical banks PBK1 through PBK3 may correspond to the number of included word lines and the first width w1 of the physical banks PBK1 through PBK3 may correspond to a size of included pages.

Although the first unit structure UNT1 includes 3 physical banks PBK1 through PBK3 in the 2-bank structure, the semiconductor memory device 100 according to some embodiments of the present disclosure may perform write, read, or pre-charge operation as in the first logic bank LBK1 and the second logic bank LBK2 of FIG. 1B and thereby, may satisfy the operating standard required for the semiconductor memory device 100.

Accordingly, in implementing the semiconductor memory device 100 with the required capacity according to some embodiments of the present disclosure, restriction on the number or the size of the physical banks PBK1 through PBK3 needed to satisfy the packaging standard of the semiconductor memory device 100 may be relaxed. Also, when the capacity required for the semiconductor memory device 100 according to some embodiments of the present disclosure is realized, the semiconductor memory device 100 may satisfy the packaging standard and may be operated according to the defined process or condition.

The packaging standard or the operating standard required for the semiconductor memory device 100 according to some embodiments of the present disclosure may correspond to the standard of Joint Electron Device Engineering Council (JEDEC). For example, the operating standard of the semiconductor memory device 100 according to some embodiments of the present disclosure may satisfy the JEDEC standard for DRAM of DDR4 (Double Data Rate 4) or DDR5.

Hereinafter, an operating method of the semiconductor memory device 100 according to some embodiments of the present disclosure in a logic bank unit will be described. Here, unless otherwise mentioned, it is assumed that the semiconductor memory device 100 according to some embodiments of the present disclosure includes 3 physical banks PBK1 through PBK3 as the first unit structure UNT1 as illustrated in FIG. 4 and is operated according to the operating standard for the 2-bank structure.

Figure 5:
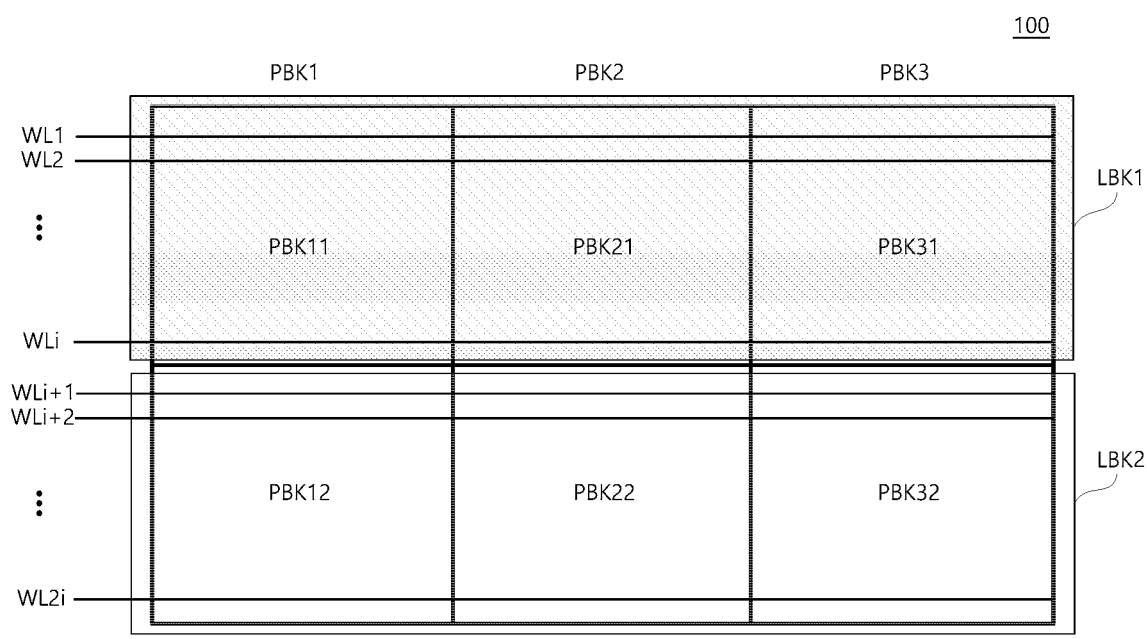
FIGS. 5 and 6 respectively illustrate a structure of a first logic bank and a second logic bank according to some embodiments of the present disclosure.
Figure 6:
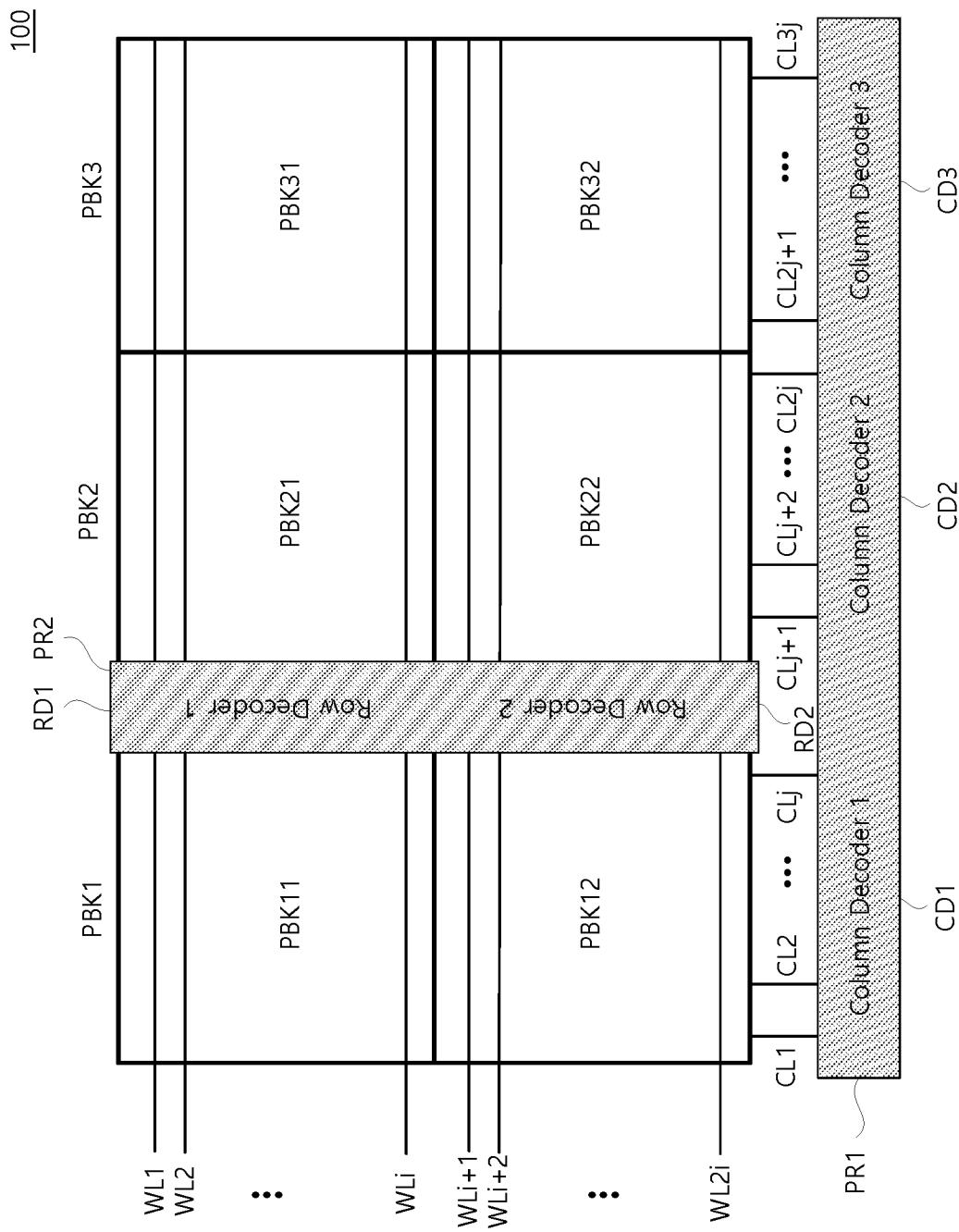

FIGS. 5 and 6 respectively illustrate a structure of the first logic bank LBK1 and the second logic bank LBK2 according to some embodiments of the present disclosure.

First, referring to FIGS. 1A and 5, n physical banks PBK1 through PBKn according to some embodiments of the present disclosure may all be included in each of the first logic bank LBK1 and the second logic bank LBK2. That is, one of the two sub-banks including all of the first physical bank PBK1 through the nth physical bank PBKn may be included in the first logic bank LBK1 and the other one may be included in the second logic bank LBK2. For example, the (1-1)-th sub-bank PBK11 through a (3-1)-th sub-bank PBK31 may be included in the first logic bank LBK1 and the (1-2)-th sub-bank PBK12 through a (3-2)-th sub-bank PBK32 may be included in the second logic bank LBK2. In other words, each of the n physical banks PBK1 through PBKn may be partially included in both the first logic bank LBK1 and the second logic bank LBK2.

In this case, the first logic bank LBK1 and the second logic bank LBK2 may correspond to a row address included in the address ADDR and thereby, may be specified or activated. The first logic bank LBK1 may correspond to a first word line WL1 through an ith (i is an integer of 2 or above) word line wLi from among word lines WL1 through WL2i of the first physical bank PBK1 through the third physical bank PBK3. For example, i may be an integer that is greater than or equal to 2. The second logic bank LBK2 may be shared by the remaining word lines WLi+1 through WL2i from the word lines WL1 through WL2i.

Accordingly, regardless of the number or the size of the physical banks PBK1 through PBK3, the semiconductor memory device 100 according to some embodiments of the present disclosure may be operated with the 2-bank structure including the first logic bank LBK1 and the second logic bank LBK2.

FIG. 5 illustrates that the first logic bank LBK1 and the second logic bank LBK2 respectively correspond to the same number of word lines WL1 through wLi and wLi+1 through WL2i and thereby, the sub-banks included in each of the physical banks PBK1 through PBK3 have the same size. For example, each size of the (1-1)-th sub-bank PBK11 through the (3-1)-th sub-bank PBK31 and each size of the (1-2)-th sub-bank PBK12 through the (3-2)-th sub-bank PBK32 may be the same.

The sizes of the sub-banks are not limited to be the same in the semiconductor memory device 100 according to some embodiments of the present disclosure. For example, the number of bad cells may be different from each other in the (1-1)-th sub-bank PBK11 through the (3-1)-th sub-bank PBK31 and the (1-2)-th sub-bank PBK12 through the (3-2)-th sub-bank PBK32 due to processing condition. Here, in order for operating characteristics of the (1-1)-th sub-bank PBK11 through the (3-1)-th sub-bank PBK31 and the (1-2)-th sub-bank PBK12 through the (3-2)-th sub-bank PBK32 to be the same, the size of the (1-1)-th sub-bank PBK11 through the (3-1)-th sub-bank PBK31 may be set to be different from that of the (1-2)-th sub-bank PBK12 through the (3-2)-th sub-bank PBK32. However, unless otherwise mentioned, it is assumed hereinafter that the sizes of the sub-banks are all the same.

Next, referring to FIGS. 1A and 6, the semiconductor memory device 100 according to some embodiments of the present disclosure may further include a first row decoder RD1 and a second row decoder RD2. The first row decoder RD1 may activate the word lines WL1 through wLi of the first logic bank LBK1 and the second row decoder RD2 may activate the word lines wLi+1 through WL2i of the second logic bank LBK2.

For example, the first row decoder RD1 may be shared by the first word line WL1 through the ith word line wLi from among the word lines WL1 through WL2i of the first physical bank PBK1 through the third physical bank PBK3. The second row decoder RD2 may be shared by the remaining word lines wLi+1 through WL2i from among the word lines WL1 through WL2i of the first physical bank PBK1 through the third physical bank PBK3. For example, the first row decoder RD1 may be shared by the first word line WL1 through the ith word line wLi from the word lines WL1 through WL2i of the first physical bank PBK1 through the third physical bank PBK3, and the second row decoder RD2 may be shared by the remaining word lines wLi+1 through WL2i from the word lines WL1 through WL2i of the first physical bank PBK1 through the third physical bank PBK3 other than the first word line WL1 through the ith word line wLi.

The first row decoder RD1 and the second row decoder RD2 may each be interposed between two physical banks adjacent to each other in a row direction from among n physical banks PBK1 through PBKn. For example, the first row decoder RD1 and the second row decoder RD2 may be between two physical banks adjacent to each other in a row direction from the n physical banks PBK1 through PBKn. For example, the first row decoder RD1 and the second row decoder RD2 may be between the first physical bank PBK1 and the second physical bank PBK2, but the present disclosure is not limited thereto. In other words, when a region, where the first row decoder RD1 and the second row decoder RD2 are disposed, is referred to as a second peripheral circuit region PR2, one second peripheral circuit region PR2 may be included for n physical banks PBK1 through PBKn.

For example, the second peripheral circuit region PR2 may be interposed between the first physical bank PBK1 and the second physical bank PBK2. For example, the first row decoder RD1 and the second row decoder RD2 may be interposed between the first physical bank PBK1 and the second physical bank PBK2 and may be adjacent to each other in a column direction. That is, the first row decoder RD1 may be interposed between the (1-1)-th sub-bank PBK11 and the (2-1)-th sub-bank PBK21 and the second row decoder RD2 may be interposed between the (1-2)-th sub-bank PBK12 and the (2-2)-th sub-bank PBK22.

However, the present disclosure is not limited thereto, and the first row decoder RD1 and the second row decoder RD2 may be interposed between other physical banks which are adjacent to each other from among n physical banks PBK1 through PBKn. For example, the first row decoder RD1 and the second row decoder RD2 may be interposed between the second physical bank PBK2 and a third physical bank PBK3.

In the semiconductor memory device 100 according to some embodiments of the present disclosure described above, the package, the capacity, and the operating condition required for the semiconductor memory device 100 may be satisfied regardless of the number or the size of the physical banks PBK1 through PBK3. Furthermore, in the semiconductor memory device 100 according to some embodiments of the present disclosure, the row decoders RD1 and RD2, which are less than the number of column decoders CD1 through CDn, are needed to operate n physical banks PBK1 through PBKn and thereby, a resource and an area may be minimized based on the same memory capacity.

Figure 7:
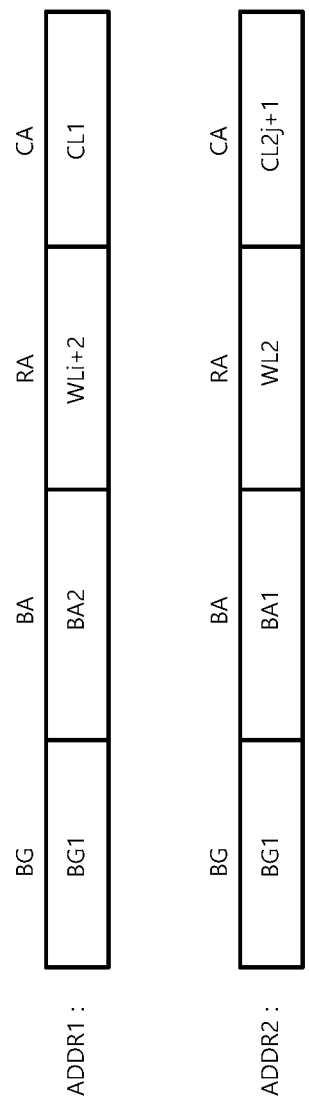
FIG. 7 is a diagram illustrating an operation of a first logic bank and a second logic bank with respect to addresses according to some embodiments of the present disclosure.

FIG. 7 is a diagram illustrating an operation of the first logic bank LBK1 and the second logic bank LBK2 with respect to addresses ADDR1 and ADDR2 according to some embodiments of the present disclosure.

Referring to FIGS. 3, 6, and 7, the first address ADDR1 and the second address ADDR2 applied to the semiconductor memory device 100 may each include a bank group address BG, a bank address BA, a row address RA, and a column address CA.

The bank group address BG may denote one of the first bank group BG1 through the yth bank group BGy. The bank address BA may denote one of the first physical bank PBK1 through the third physical bank PBK3 and the first-prime physical bank PBK1' through the third-prime physical bank PBK3' included in each of the bank group BG1 through BGy. The row address RA may denote one of the first word line WL1 through the 2ith word line WL2i of the first physical bank PBK1 through the third physical bank PBK3 or the first-prime physical bank PBK1' through the third-prime physical bank PBK3'. The column address CA may denote one of the first column line CL1 through 3jth (j is an integer of 2 or above) column line CL3j of the first physical bank PBK1 through the third physical bank PBK3 or the first-prime physical bank PBK1' through the third-prime physical banks PBK3'. For example, j may be an integer that is greater than or equal to 2.

For convenience of description, hereinafter, the operation of the first logic bank LBK1 and the second logic bank LBK2 will be described only with respect to the first physical bank PBK1 through the third physical bank PBK3. Here, the operation of the first logic bank LBK1 and the second logic bank LBK2 may be equally applied to the first-prime physical bank PBK1' through the third-prime physical bank PBK3'.

In FIG. 7, the first address ADDR1 and the second address ADDR2 indicate access to the first bank group BG1. The first address ADDR1 indicates a first value BA2 as the bank address BA and the second address ADDR2 indicates a second value BA1 as the bank address BA. The first address ADDR1 and the second address ADDR2 may be operated regardless of the bank address BA in the semiconductor memory device 100 of FIG. 6.

The first address ADDR1 may indicate an i+2th word line WLi+2 as the row address RA and the second address ADDR2 may indicate the second word line WL2 as the row address RA. As illustrated in FIG. 6, when the (1-1)-th sub-bank PBK11 through the (3-1)-th sub-bank PBK31 are included in the first logic bank LBK1 and the (1-2)-th sub-bank PBK12 through the (3-2)-th sub-bank PBK32 are included in the second logic bank LBK2, the first logic bank LBK1 and the second logic bank LBK2 which are to be accessed by the row address RA may be specified.

That is, the row address RA of the first address ADDR1 indicates the i+2th word line WLi+2 included in the i+1th word line WLi+1 through the 2ith word line WL2i of the (1-2)-th sub-bank PBK12 through the (3-2)-th sub-bank PBK32 and thus, the second logic bank LBK2 or the second row decoder RD2 may be activated in response to the first address ADDR1. Similarly, the row address RA of the second address ADDR2 indicates the second word line WL2 included in the first word line WL1 through the ith word line WLi of the (1-1)-th sub-bank PBK11 through the (3-1)-th sub-bank PBK31 and thereby, the first logic bank LBK1 or the first row decoder RD1 may be activated in response to the second address ADDR2.

The first address ADDR1 may indicate the first column line CL1 as the column address CA and the second address ADDR2 may indicate a 2j+1th column line CL2j+1 as the column address CA. The first column decoder CD1 may activate the corresponding column line in response to the column address CA for the first column line CL1 through a jth column line CLj and the second column decoder CD2 may activate the corresponding column line in response to the column address CA for a j+1th column line CLj+1 through a 2jth column line CL2j. Similarly, a third column decoder CD3 may activate the corresponding column line in response to the column address CA for the 2j+1th column line CL2j+1 through a 3jth column line CL3j. Accordingly, the first column decoder CD1 may be activated in response to the first address ADDR1 and the third column decoder CD3 may be activated in response to the second address ADDR2.

Figure 8A:
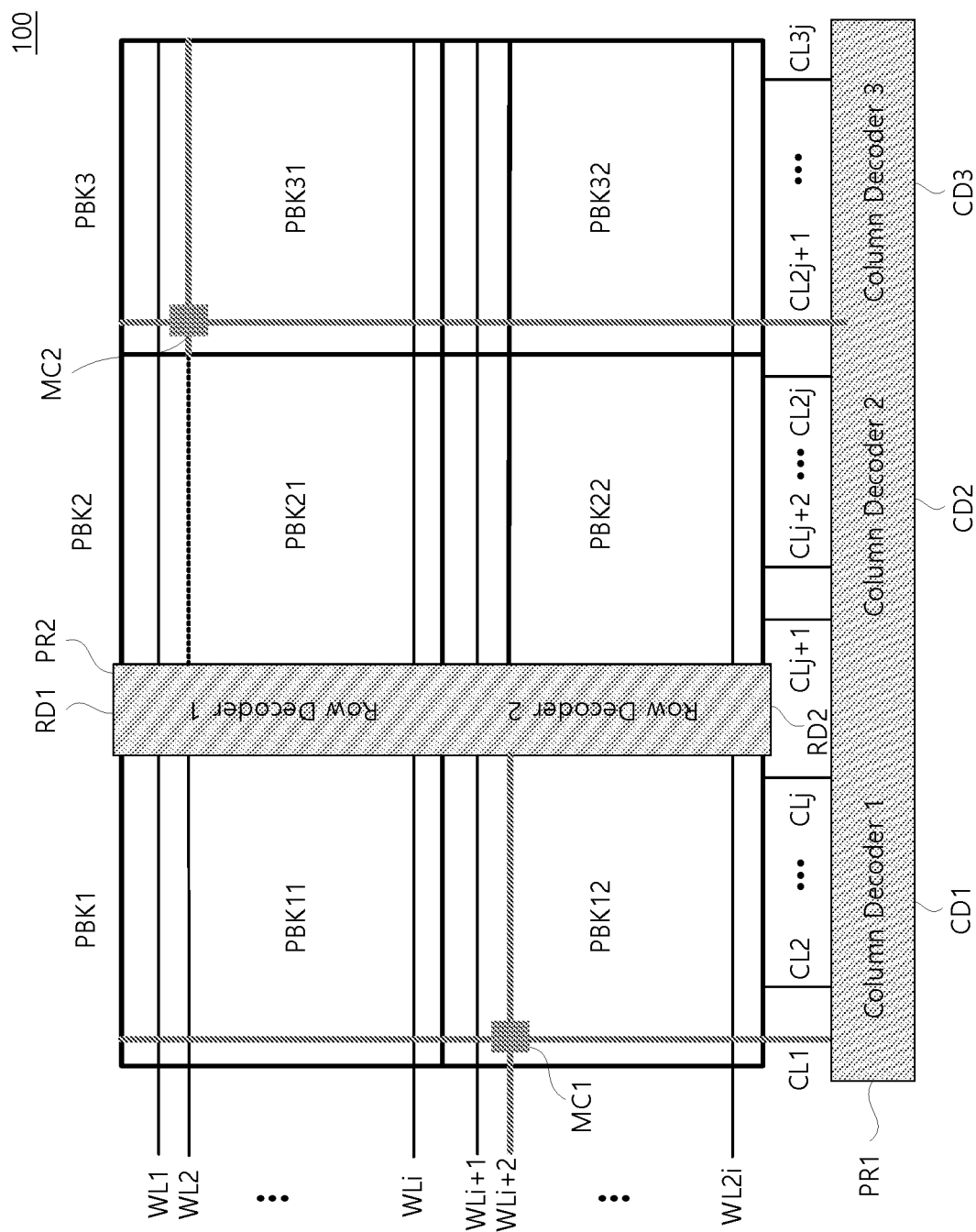
FIGS. 8A and 8B respectively illustrate memory cells accessed in response to the addresses of FIG. 7.
Figure 8B:
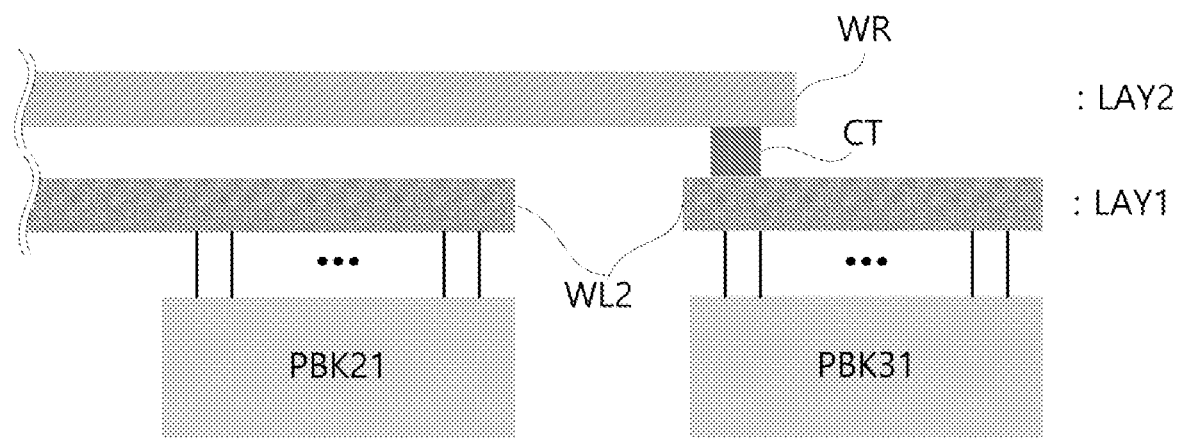

FIGS. 8A and 8B respectively illustrate memory cells MC1 and MC2 accessed in response to the addresses ADDR1 and ADDR2 of FIG. 7.

First, referring to FIGS. 7 and 8A, the first memory cell MC1 of the (1-2)-th sub-bank PBK12 may be activated in response to the first address ADDR1 and the second memory cell MC2 of the (3-1)-th sub-bank PBK31 may be activated in response to the second address ADDR2. As described above, the logic banks LBK1 and LBK2 are activated based on the row address RA, instead of the bank address BA, and thus, the semiconductor memory device 100 may satisfy the operating condition for the 2-bank structure, regardless of the number of physical banks PBK1 through PBK3.

The second word line WL2 of the (3-1)-th sub-bank PBK31, which is spaced apart from the first row decoder RD1, may not be connected to the second word line WL2 of the (2-1)-th sub-bank PBK21.

For example, referring to FIG. 8B, the second word line WL2 connected to the first row decoder RD1 may be formed on a first layer LAY1. Here, the word line WL2 of the (2-1)-th sub-bank PBK21, which is adjacent to the first row decoder RD1, may be directly connected to the first row decoder RD1, whereas the word line WL2 of the (3-1)-th sub-bank PBK31, which is spaced apart from the first row decoder RD1, may be connected to the first row decoder RD1 through a connecting wire WR disposed on a second layer LAY2, which is different from the first layer LAY1. The word line WL2 of the (3-1)-th sub-bank PBK31 disposed on the first layer LAY1 and the connecting wire WR disposed on the second layer LAY2 may be electrically connected to each other through a connecting contact CT.

As described above, the semiconductor memory device 100 according to some embodiments of the present disclosure may satisfy the package, the capacity, and the operating condition required for the semiconductor memory device 100 regardless of the number or the size of the physical banks PBK1 through PBK3. Furthermore, in the semiconductor memory device 100 according to some embodiments of the present disclosure, the number of memory cells connected to the word lines WL1 through WL2i is minimized and thereby, a load of the word lines WL1 through WL2i is decreased. Accordingly, more accurate operation may be performed and power consumption may be reduced.

As described above, the connection structure of the first row decoder RD1 and the second word line WL2 may be equally applied to the second row decoder RD2 or other word lines. Also, when the first row decoder RD1 and the second row decoder RD2 are interposed between the second physical bank PBK2 and the third physical bank PBK3, the connection structure may be equally applied to the connection structure of the first physical bank PBK1.

Figure 9:
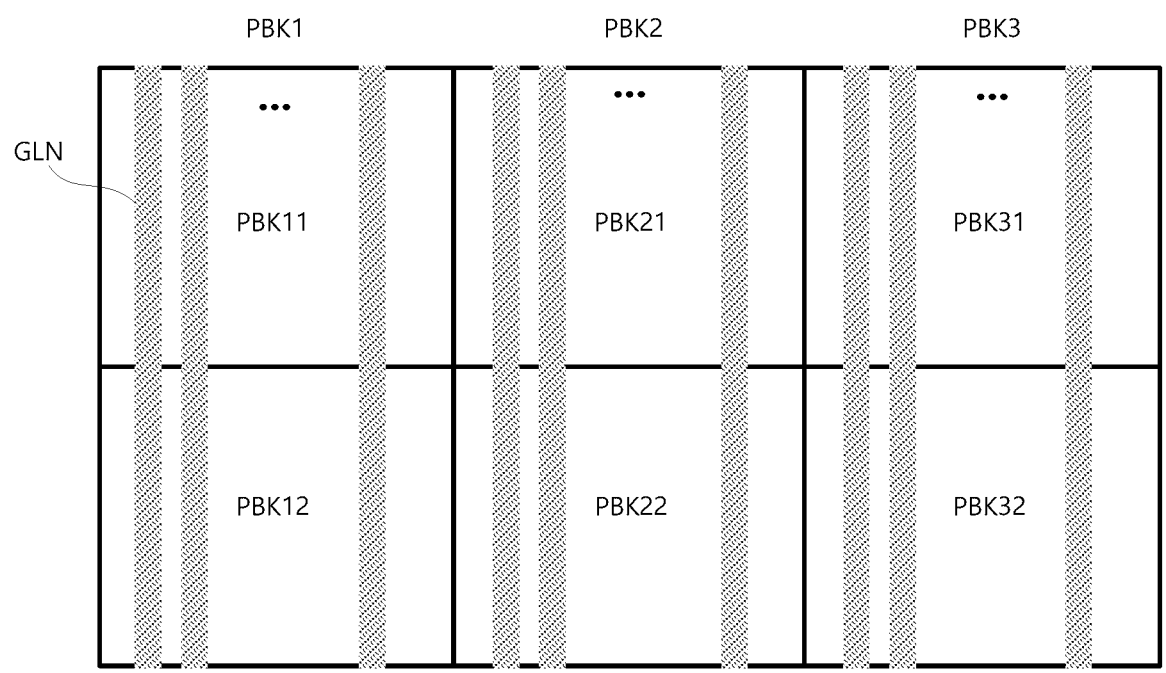
FIG. 9 illustrates a global input and output line of a semiconductor memory device according to some embodiments of the present disclosure.
Figure 10:
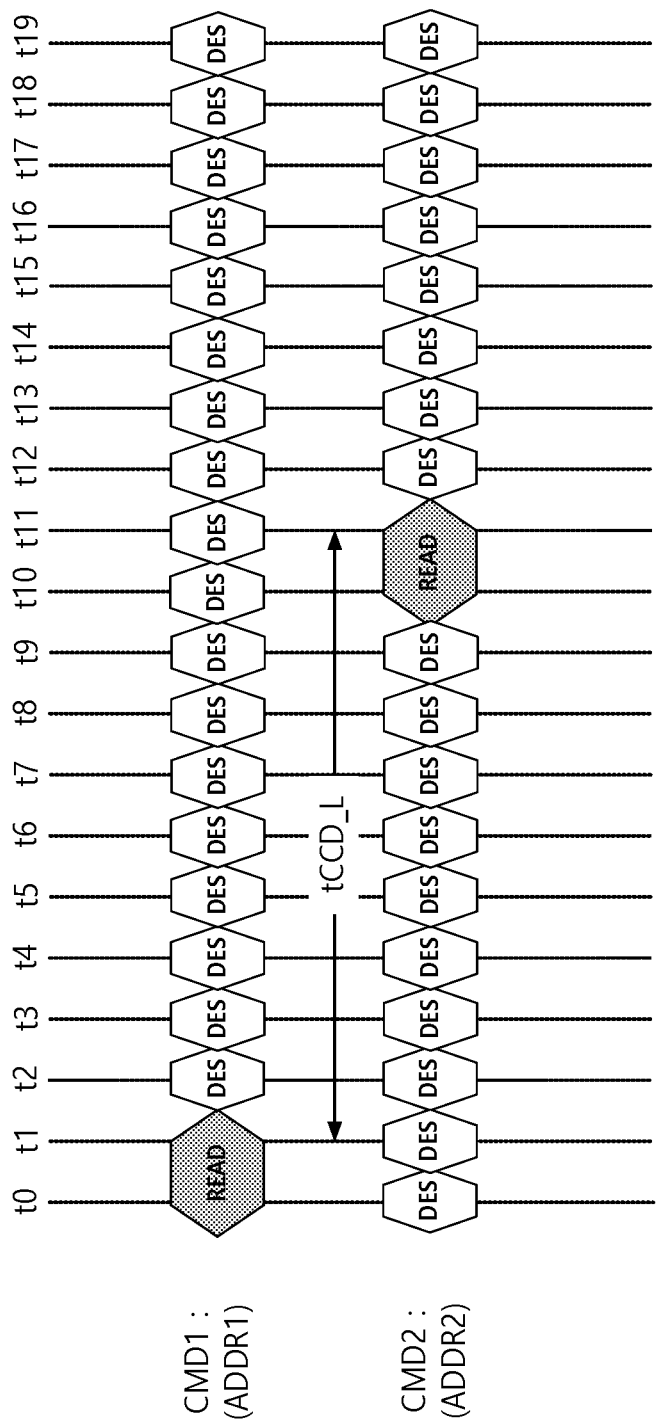
FIG. 10 illustrates a read operation of a semiconductor memory device according to some embodiments of the present disclosure.

FIG. 9 illustrates a global input and output line GLN of the semiconductor memory device 100 according to some embodiments of the present disclosure and FIG. 10 illustrates a read operation of the semiconductor memory device 100 according to some embodiments of the present disclosure.

First, referring to FIGS. 1A and 9, the global input and output lines GLN for the first physical bank PBK1 through the third physical bank PBK3 according to some embodiments of the present disclosure may each be shared by the first logic bank LBK1 and the second logic bank LBK2.

The global input and output lines GLN may be prepared in a unit of an arbitrary number of column lines from among the column lines CL. For example, a pair of global input and output lines GLN may be included in every three pairs of column lines CL. The global input and output lines GLN may be connected to the column decoders CD1 through CDn. In this regard, the global input and output line GLN corresponding to the activated column line CL may be selected in response to the address ADDR. A voltage of the global input and output line GLN selected by the column decoders CD1 through CDn may be sensed and amplified by a global input and output sense amplifier (not illustrated) to be output as read data (not illustrated).

Next, referring to FIGS. 7, 9, and 10, although each global input and output line GLN according to some embodiments of the present disclosure is shared by the first logic bank LBK1 and the second logic bank LBK2, an operation of the first logic bank LBK1 and the second logic bank LBK2 may be each independently performed. For example, the first logic bank LBK1 and the second logic bank LBK2, which share an access to the global input and output line GLN, may be sequentially performed at a time interval of a Cas-to-Cas delay (tCCD). tCCD is a minimum time interval between continuing read command or write command to perform accurate operation in the semiconductor memory device 100.

FIG. 10 illustrates that a first read command CMD1 corresponding to the first address ADDR1 is generated at the point t1 and then, a second read command CMD2 corresponding to the second address ADDR2 is generated after the time elapsed by tCCD_L, which is at the point ta+1 (e.g., t11). tCCD_L may be a parameter indicating a read to read delay in tCCD for the same bank in the same bank group. When the first address ADDR1 and the second address ADDR2 are generated as illustrated in FIG. 7, the second logic bank LBK2 may be activated in response to the first address ADDR1 and then, the second logic bank LBK2 may be activated in response to the second address ADDR2 after the time elapsed by tCCD_L.

Referring to FIGS. 7, 8A, and 9, the first memory cell MC1 corresponding to the first address ADDR1 and the second memory cell MC2 corresponding to the second address ADDR2 are included in each different physical bank PBK1 and PBK3 and thus, the first memory cell MC1 and the second memory cell MC2 may be read through each different global input and output line GLN. Although the column address CA of the second address ADDR2 corresponds to the first physical bank PBK1 and the global input and output line GLN, to which a voltage of the memory cell is applied by the first command CMD1 and the second command CMD2, is the same, the first command CMD1 and the second command CMD2 are performed at a time interval of tCCD_L and thereby, a collision at the shared global input and output line GLN may not occur.

Figure 11:
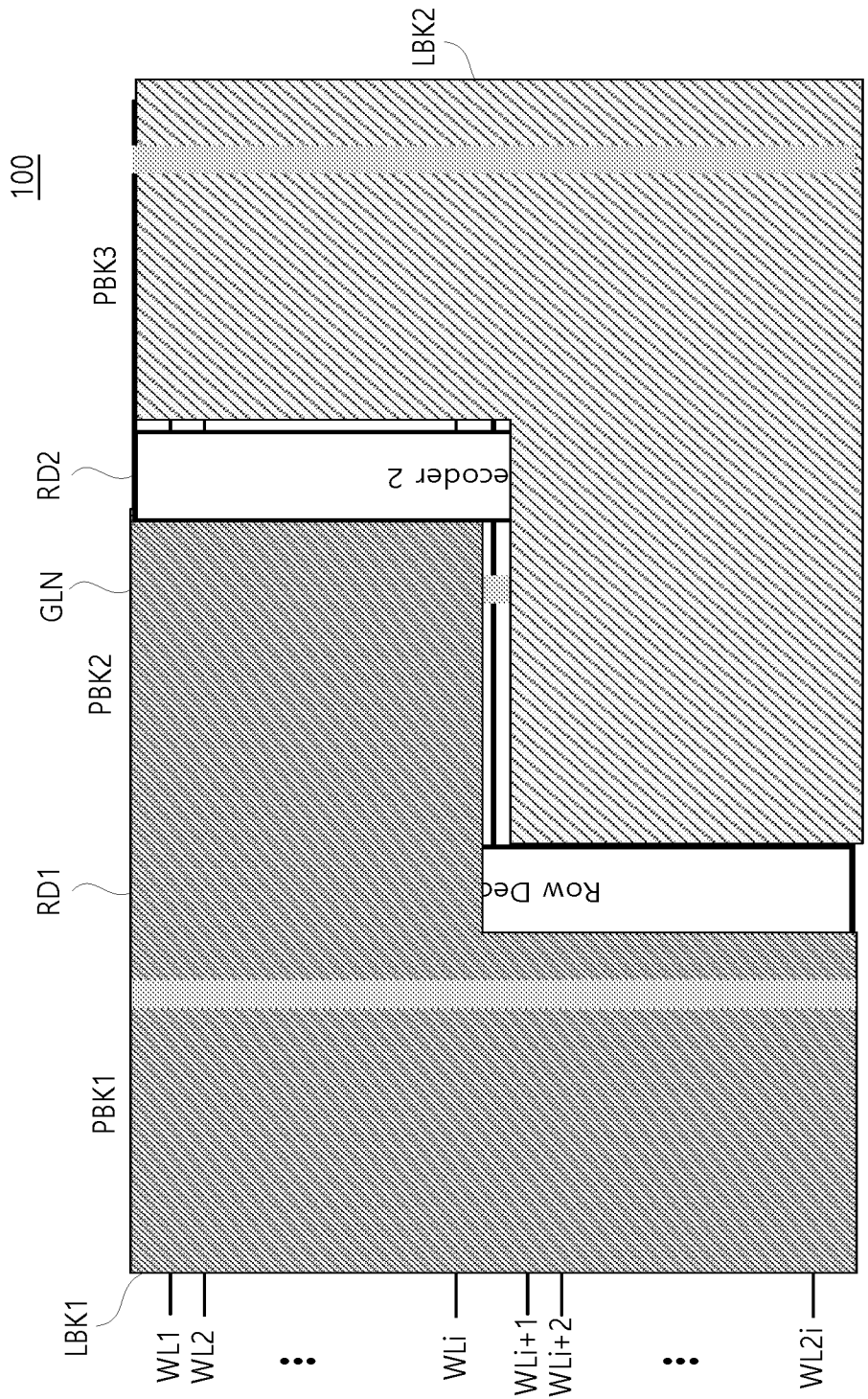
FIG. 11 illustrates another structure of a first logic bank and a second logic bank according to some embodiments of the present disclosure.

FIG. 11 illustrates another structure of the first logic bank LBK1 and the second logic bank LBK2 according to some embodiments of the present disclosure.

Referring to FIGS. 1A and 11, at least a pair of physical banks from among n physical banks PBK1 through PBKn according to some embodiments of the present disclosure may be included in each different logic bank from among the first logic bank LBK1 and the second logic bank LBK2. For example, the first physical bank PBK1 may be included in the first logic bank LBK1 and the third physical bank PBK3 may be included in the second logic bank LBK2. Also, the remaining physical banks from among n physical banks PBK1 through PBKn may be all included in the first logic bank LBK1 and the second logic bank LBK2. For example, the (2-1)-th sub-bank PBK21 of the second physical bank PBK2 may be included in the first logic bank LBK1 and the (2-2)-th sub-bank PBK22 of the second physical bank PBK2 may be included in the second logic bank LBK2. For example, at least one physical bank (e.g., PBK1) from the n physical banks PBK1 through PBKn may be entirely included in the first logic bank LBK1, at least one physical bank (e.g., PBK3) from the n physical banks PBK1 through PBKn may be entirely included in the second logic bank LBK2, and at least one physical bank (e.g., PBK2) from the n physical banks PBK1 through PBKn may be partially included in the first and second logic banks LBK1 and LBK2 (e.g., the (2-1)-th sub-bank PBK21 of the second physical bank PBK2 may be included in the first logic bank LBK1 and the (2-2)-th sub-bank PBK22 of the second physical bank PBK2 may be included in the second logic bank LBK2).

Here, the global input and output line GLN for the second physical bank PBK2 included in both the first logic bank LBK1 and the second logic bank LBK2 (e.g., the (2-1)-th sub-bank PBK21 of the second physical bank PBK2 included in the first logic bank LBK1 and the (2-2)-th sub-bank PBK22 of the second physical bank PBK2 included in the second logic bank LBK2) may be shared while the first logic bank LBK1 and the second logic bank LBK2 operate (see FIGS. 9 and 10 for more details). For convenience of description, FIG. 11 illustrates one global input and output line GLN for each of the physical banks PBK1 through PBK3, however, there may be a plurality of global input and output lines GLN for each of the physical banks PBK1 through PBK3.

The first row decoder RD1 for the first logic bank LBK1 may be shared by all word lines WL1 through WL2i of the physical banks included in first logic bank LBK1 as a whole and a part of the word lines WL1 through Wli or Wli+1 through WL2i of the physical banks included in first logic bank LBK1. For example, the first row decoder RD1 may activate all word lines WL1 through WL2i of the first physical bank PBK1 and the first word line WL1 through the ith word line WLi of the (2-1)-th sub-bank PBK21. In other words, the first row decoder RD1 may activate 2i word lines (e.g., all word lines) of the first physical bank PBK1 that is entirely included in the first logic bank LBK1 and the first word line WL1 through the ith word line WLi of the second physical bank PBK2 that is partially included in the first and second logic banks LBK1 and LBK2. Also, the second row decoder RD2 may be shared in the same manner. The second row decoder RD2 may activate all word lines WL1 through WL2i of the third physical bank PBK3 and the i+1th word line WLi+1 through the 2ith word line WL2i of the (2-2)-th sub-bank PBK22 which is partially included in the second logic bank LBK2. In other words, the second row decoder RD2 may activate 2i word lines (e.g., all word lines) of the third physical bank PBK3 that is entirely included in the second logic bank LBK2 and the i+1th word line WLi+1 through the 2ith word line WL2i of the second physical bank PBK2 that is partially included in the first and second logic banks LBK1 and LBK2.

The first row decoder RD1 and the second row decoder RD2 may be spaced apart from each other between two physical banks which are adjacent to each other from among n physical banks PBK1 through PBKn. For example, the first row decoder RD1 may be interposed between the first physical bank PBK1 and the second physical bank PBK2, which are adjacent to each other, and the second row decoder RD2 may be interposed between the second physical bank PBK2 and the third physical bank PBK3, which are adjacent to each other. For example, the first row decoder RD1 and the second row decoder RD2 may be spaced apart from each other with at least one physical bank (e.g., the second physical bank PBK2) from the n physical banks PBK1 through PBKn therebetween. Accordingly, the first row decoder RD1 and the second row decoder RD2 may be spaced apart from each other.

As described above, the semiconductor memory device 100 according to some embodiments of the present disclosure may satisfy the package, the capacity, and the operating condition required for the semiconductor memory device 100 regardless of the number or the size of the physical banks PBK1 through PBKn. Furthermore, in the semiconductor memory device 100 according to some embodiments of the present disclosure, the first logic bank LBK1 and the second logic bank LBK2 are in various forms and thereby, flexibility on designing of the semiconductor memory device 100 may be improved.

As above, examples where n is 3 are mainly described, however, the semiconductor memory device 100 according to some embodiments of the present disclosure may include a plurality of physical banks (e.g., where n is greater than 3).

FIGS. 12A, 12B, 13A, and 13B each illustrate a different structure of the first unit structure UNT1 according to some embodiments of the present disclosure.

Figure 12A:
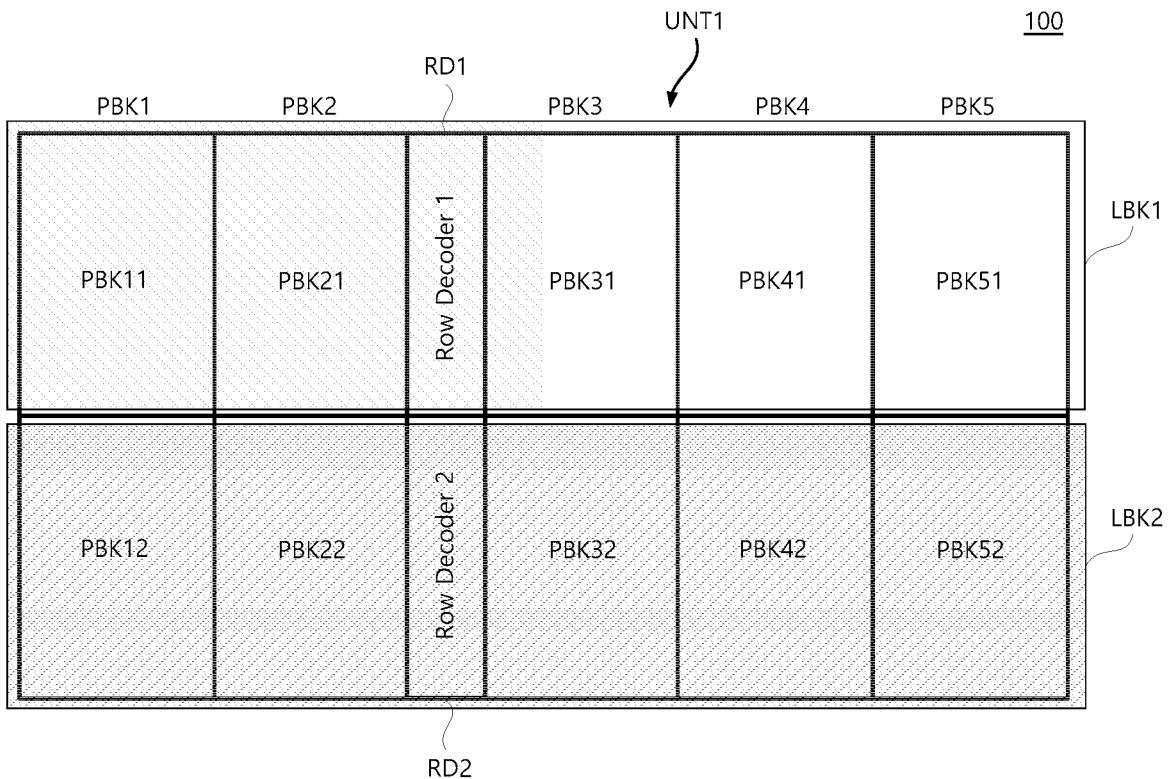
FIGS. 12A, 12B, 13A, and 13B each illustrate a different structure of a first unit structure according to some embodiments of the present disclosure.
Figure 12B:
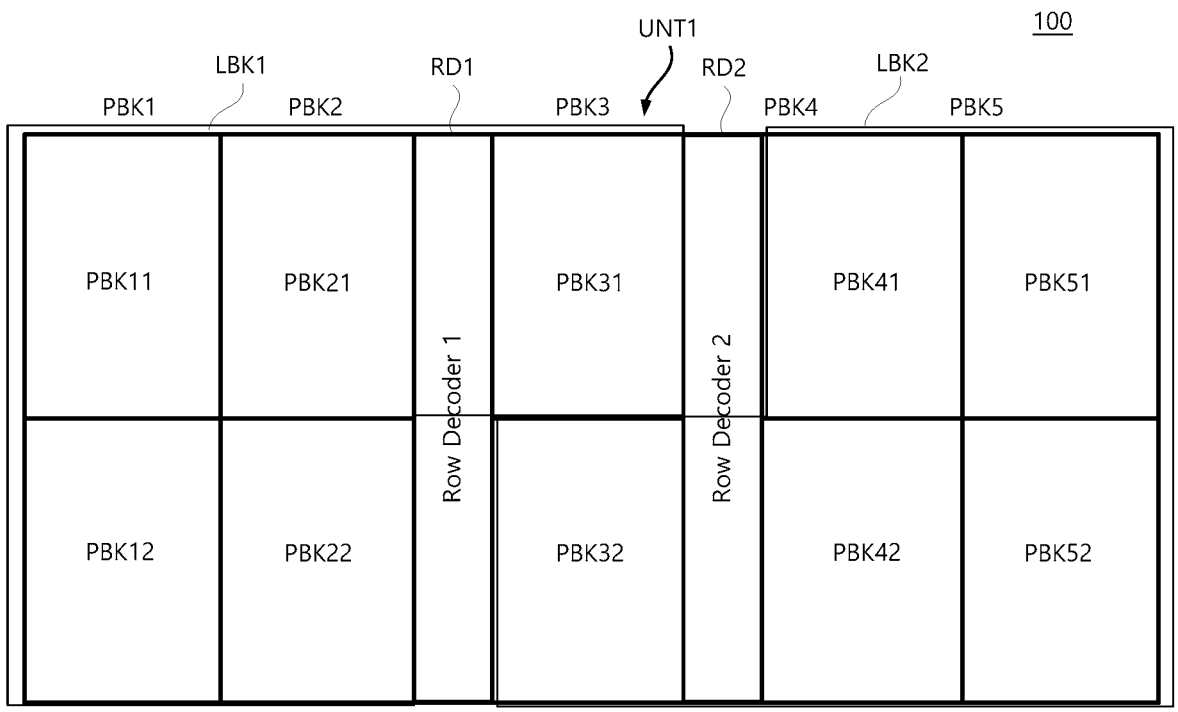

First, referring to FIGS. 12A and 12B, the semiconductor memory device 100 according to some embodiments of the present disclosure may include 5 physical banks PBK1 through PBK5 as the first unit structure UNT1 which corresponds to one 2-bank structure.

For example, as shown in FIG. 12A, 5 physical banks PBK1 through PBK5 may each be included in both the first logic bank LBK1 and the second logic bank LBK2. That is, the (1-1)-th sub-bank PBK11 through a (5-1)-th sub-bank PBK51 may be included in the first logic bank LBK1 and the (1-2)-th sub-bank PBK12 through a (5-2)-th sub-bank PBK52 may be included in the second logic bank LBK2. In other words, each of the 5 physical banks PBK1 through PBK5 may be partially included in both the first logic bank LBK1 and the second logic bank LBK2. Here, the first row decoder RD1 and the second row decoder RD2 may be interposed between the second physical bank PBK2 and the third physical bank PBK3, which are adjacent to each other in a row direction.

Also, as shown in FIG. 12B, at least a pair of physical banks from among 5 physical banks PBK1 through PBK5 may be included in one of the first logic bank LBK1 or the second logic bank LBK2 and the rest may be included in both of the first logic bank LBK1 and the second logic bank LBK2. For example, the first physical bank PBK1, the second physical bank PBK2, and the (3-1)-th sub-bank PBK31 may be included in the first logic bank LBK1, and the (3-2)-th sub-bank PBK32, a fourth physical bank PBK4, and a fifth physical bank PBK5 may be included in the second logic bank LBK2.

Here, the first row decoder RD1 and the second row decoder RD2 may be spaced apart from each other between two physical banks which are adjacent to each other in a row direction. For example, the first row decoder RD1 may be interposed between the second physical bank PBK2 and the third physical bank PBK3, which are adjacent to each other, and the second row decoder RD2 may be interposed between the third physical bank PBK3 and the fourth physical bank PBK4, which are adjacent to each other. For example, the first row decoder RD1 and the second row decoder RD2 may be spaced apart from each other with a physical bank (e.g., the third physical bank PBK3) from the 5 physical banks PBK1 through PBK5 therebetween. Accordingly, the first row decoder RD1 and the second row decoder RD2 may be spaced apart from each other.

Figure 13A:
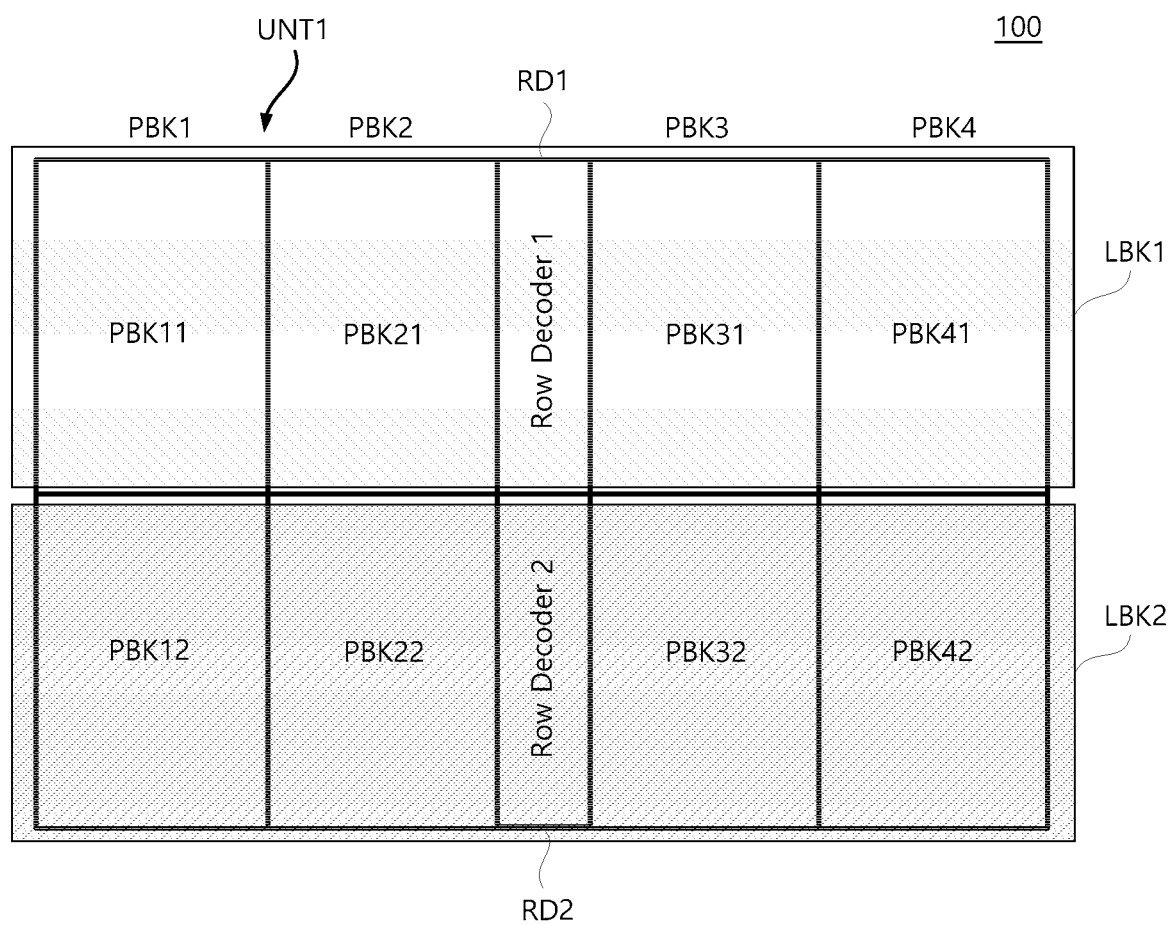
Figure 13B:
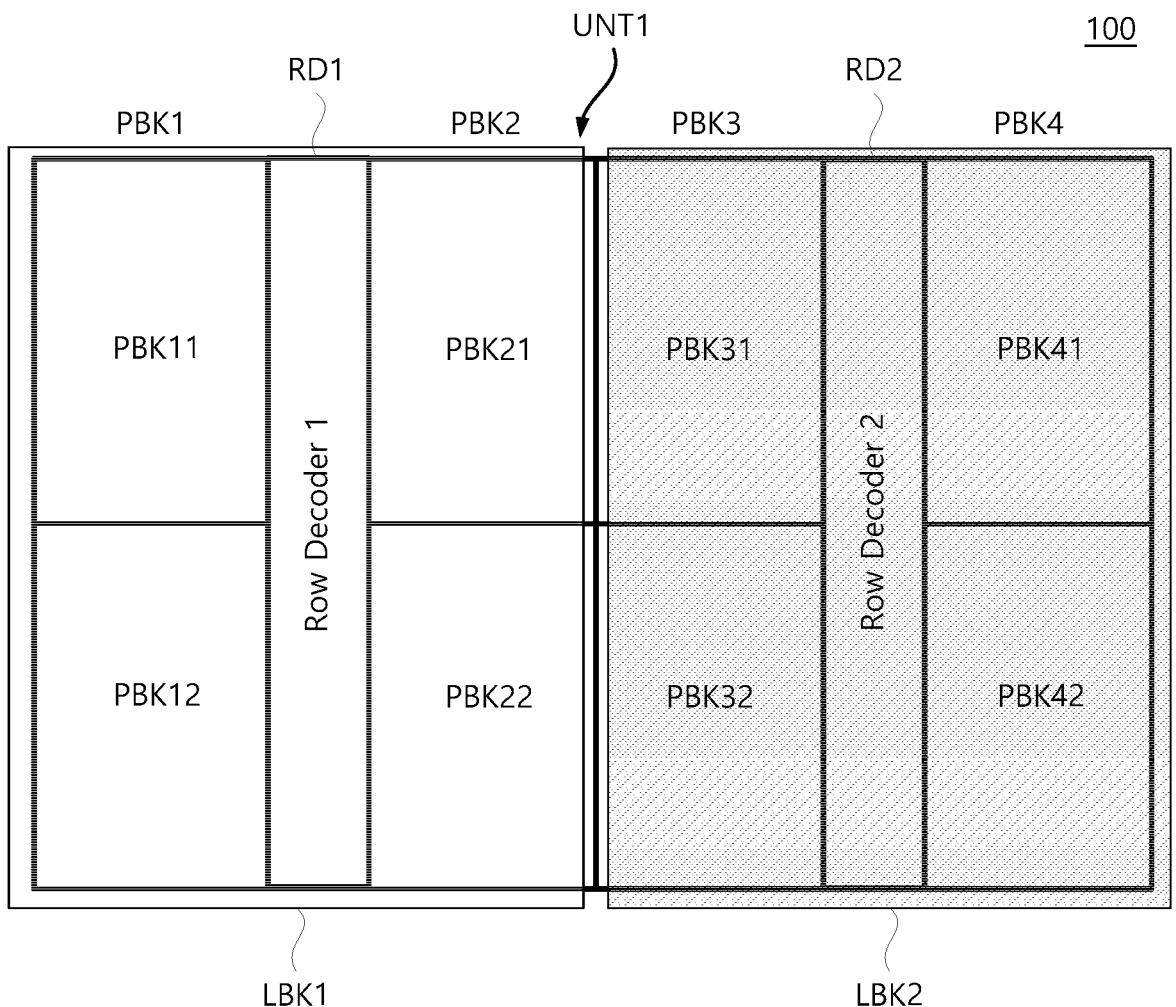

Next, referring to FIGS. 13A and 13B, the semiconductor memory device 100 according to some embodiments of the present disclosure may include even-numbered physical banks PBK1 through PBK4 as the first unit structure UNT1 which corresponds to one 2-bank structure.

For example, as shown in FIG. 13A, 4 physical banks PBK1 through PBK4 may each be included in both the first logic bank LBK1 and the second logic bank LBK2. That is, the (1-1)-th sub-bank PBK11 through a (4-1)-th sub-bank PBK41 may be included in the first logic bank LBK1 and the (1-2)-th sub-bank PBK12 through a (4-2)-th sub-bank PBK42 may be included in the second logic bank LBK2. Here, the first row decoder RD1 and the second row decoder RD2 may be interposed between the second physical bank PBK2 and the third physical bank PBK3, which are adjacent to each other in a row direction.

Also, as shown in FIG. 13B, 4 physical banks PBK1 through PBK4 may be respectively included in one of the first logic bank LBK1 or the second logic bank LBK2. For example, the first physical bank PBK1 and the second physical bank PBK2 may be included in the first logic bank LBK1 and the third physical PBK3 and the fourth physical bank PBK4 may be included in the second logic bank LBK2.

Here, the first row decoder RD1 and the second row decoder RD2 may be spaced apart from each other between two physical banks which are adjacent to each other in a row direction. For example, the first row decoder RD1 may be interposed between the first physical bank PBK1 and the second physical bank PBK2, which are adjacent to each other, and the second row decoder RD2 may be interposed between the third physical bank PBK3 and the fourth physical bank PBK4, which are adjacent to each other. For example, the first row decoder RD1 and the second row decoder RD2 may be spaced apart from each other with two physical banks (e.g., the second physical bank PBK2 and the third physical bank PBK3) from the 4 physical banks PBK1 through PBK4 therebetween. Accordingly, the first row decoder RD1 and the second row decoder RD2 may be spaced apart from each other.

In each of FIGS. 12A, 12B, 13A, and 13B, the proportion of the sum of the widths of each of the physical banks PBK1 through PBK5 or PBK1 through PBK4 in a row direction to the height of each physical bank in a column direction may be a real number multiple, instead of a multiple of 2 (e.g., may be a real number multiple that is not a multiple of 2).

As described above, the semiconductor memory device 100 according to some embodiments of the present disclosure may satisfy the package, the capacity, and the operating condition required for the semiconductor memory device 100 regardless of the number or the size of the physical banks PBK1 through PBK5 or PBK1 through PBK4. In addition, the semiconductor memory device 100 according to some embodiments of the present disclosure may include a plurality of physical banks and thereby, flexibility on designing of the semiconductor memory device 100 may be improved. Furthermore, a quantity of included physical banks may be selected so as to realize the physical banks with the maximum capacity within the standardized package.

Figure 14:
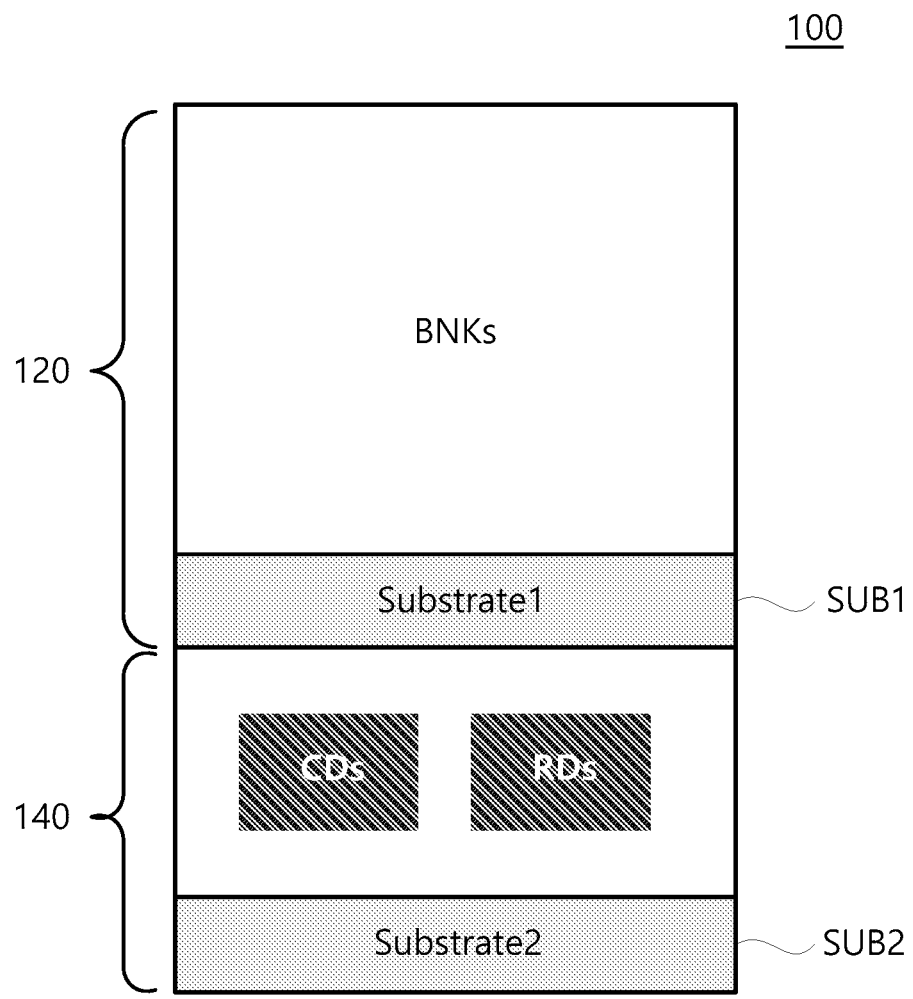
FIG. 14 illustrates a semiconductor memory device having a cell on periphery (COP) structure according to some embodiments of the present disclosure.

FIG. 14 illustrates the semiconductor memory device 100 having a cell on periphery (COP) structure according to some embodiments of the present disclosure.

Referring to FIG. 14, the semiconductor memory device 100 according to some embodiments of the present disclosure may have a COP structure. For example, a memory cell region 120, where banks BNKs are included, may be formed on a first substrate SUB1 and a peripheral circuit region 140 may be formed on a second substrate SUB2. The first substrate SUB1 may be stacked on and overlap the second substrate SUB2 in a vertical direction. As used herein, "an element A overlapping an element B in a direction X" (or similar language) may mean that there is at least one line that extends in the direction X and intersects both the elements A and B. The banks BNKs may denote the physical banks PBK1 through PBKn in FIG. 1A and the logic banks LBK1 and LBK2 in FIG. 1B.

Here, the first substrate SUB1 may be disposed at the upper part of the second substrate SUB2 in a vertical direction. However, the present disclosure is not limited thereto and the second substrate SUB2 may be disposed at the upper part of the first substrate SUB1 in consideration of operating characteristics or process characteristics. For example, the first substrate SUB1 may be on an upper surface of the second substrate SUB2. However, the present disclosure is not limited thereto and the second substrate SUB2 may be on an upper surface of the first substrate SUB1 in consideration of operating characteristics and/or process characteristics. The peripheral circuit region 140 includes the first peripheral circuit region PR1 and the second peripheral circuit region PR2 of FIG. 6, which include the column decoders CD1 through CD3 (e.g., CDs) and the row decoders RD1 and RD2 (e.g., RDs).

As described above, the semiconductor memory device 100 according to some embodiments of the present disclosure may satisfy the package, the capacity, and the operating condition required for the semiconductor memory device 100 regardless of the number or the size of the physical banks PBK1 through PBKn of FIG. 1A. Furthermore, in the semiconductor memory device 100 according to some embodiments of the present disclosure, the peripheral circuit region 140 may overlap the banks BNKs in a vertical direction and thereby, an area may be minimized.

Figure 15:
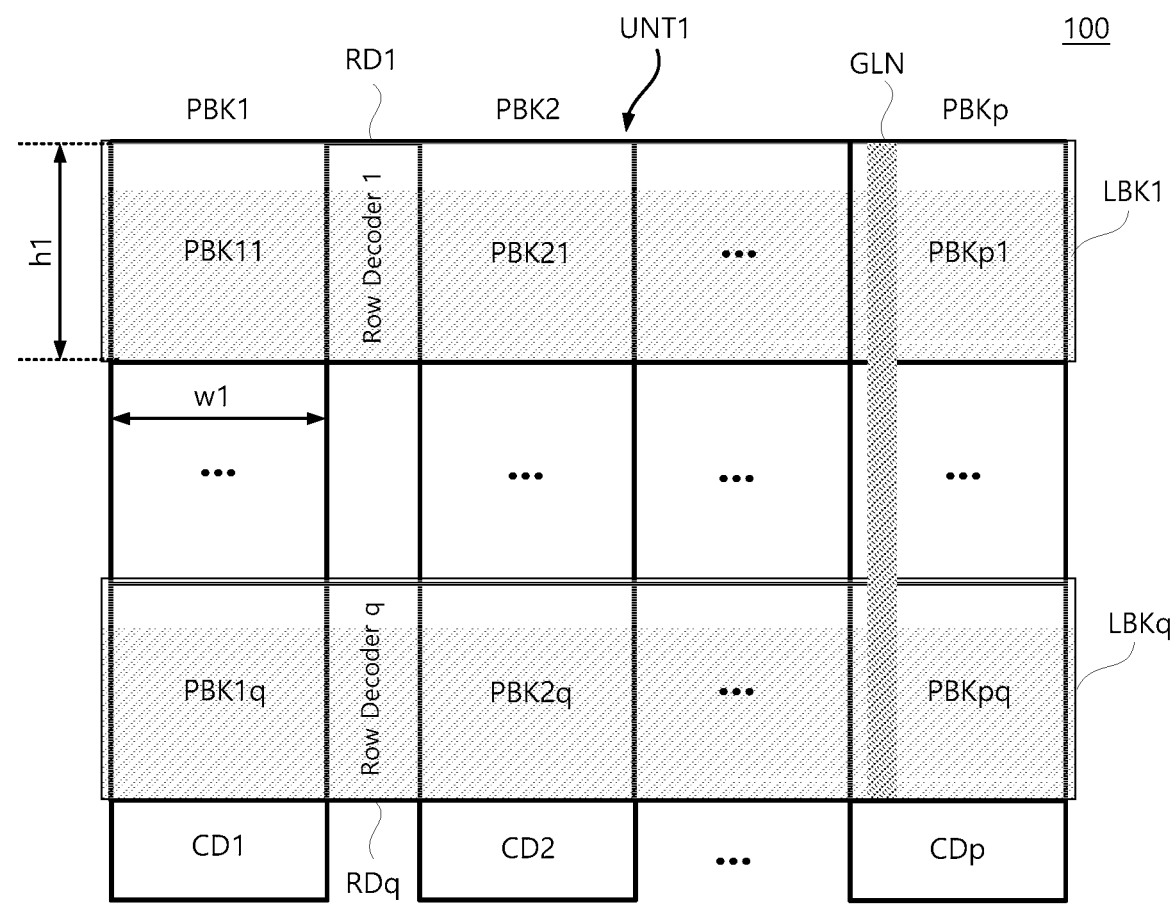
FIG. 15 illustrates a semiconductor memory device according to some embodiments of the present disclosure.

FIG. 15 illustrates the semiconductor memory device 100 according to some embodiments of the present disclosure.

Referring to FIG. 15, the semiconductor memory device 100 according to some embodiments of the present disclosure may include the first unit structure UNT1 repeatedly. As described above, the first unit structure UNT1 may be a smallest repeating unit in the semiconductor memory device 100.

The first unit structure UNT1 of FIG. 15 may include p (p is an odd number) physical banks PBK1 through PBKp, p column decoders CD1 through CDp, and q (q is smaller than p and is a positive integer of 2 or above) row decoders RD1 through RDq. For example, p may be a positive integer that is odd, and q may be a positive integer that is greater than or equal to 2 but less than p.

p physical banks PBK1 through PBKp may each include at least two sub-banks. For example, the first physical bank PBK1 may include the (1-1)-th sub-bank PBK11 through a (1-q)-th sub-bank PBK1q, the second physical bank PBK2 may include the (2-1)-th sub-bank PBK21 through a (2-q)-th sub-bank PBK2q, and the pth physical bank PBKp may include a (p-1)-th sub-bank PBKp1 through a (p-q)-th sub-bank PBKpq.

The number of column decoders CD1 through CDp is p which is same as the number of physical banks PBK1 through PBKp. The column decoders CD1 through CDp may be connected to the corresponding physical banks from among the physical banks PBK1 through PBKp through the global input and output line GLN. For convenience of description, FIG. 15 illustrates one global input and output line GLN, however, there may be a plurality of global input and output lines GLN for each of the physical banks PBK1 through PBKp.

From among the sub-banks of the physical banks PBK1 through PBKp, the sub-banks disposed at the same position in a row direction may be included in the same logic bank from among q logic banks LBK1 through LBKq. For example, the (1-1)-th sub-bank PBK11 through the (p-1)-th sub-bank PBKp1 disposed at the same position in a row direction may be included in the first logic bank LBK1. Also, the (1-q)-th sub-bank PBK1q through the (p-q)-th sub-bank PBKpq disposed at the same position in a row direction may be included in the qth logic bank LBKq. In other words, ones of the sub-banks of the physical banks PBK1 through PBKp that are at a same position along a row direction may be included in the same logic bank from among q logic banks LBK1 through LBKq.

The row decoders RD1 through RDq may correspond to q logic banks LBK1 through LBKq. That is, q row decoders RD1 through RDq may each activate the word line included in the corresponding logic bank from among q logic banks LBK1 through LBKq. The number of row decoders RD1 through RDq may be smaller than the number of column decoders CD1 through CDp (e.g., because p>q). FIG. 15 illustrates that the row decoders RD1 through RDq are all interposed between the first physical bank PBK1 and the second physical bank PBK2, however, the present disclosure is not limited thereto.

When p is 3 and q is 2, the semiconductor memory device 100 in FIG. 15 may have a structure that is the same as that of the semiconductor memory device 100 in FIGS. 6 through 10 and may perform same operation. When p is not 3 or q is not 2, the structure and operation of the semiconductor memory device 100 in FIG. 15 may be implemented by one of ordinary skill in the art based on the description in FIGS. 6 to 10.

Also, in FIG. 15, the proportion of the sum p*w1 of the respective first widths w1 of p physical banks PBK1 through PBKp to the first height h1 of each of the physical banks PBK1 through PBKp may be a real number multiple, instead of a multiple of 2 (e.g., may be a real number multiple that is not a multiple of 2).

As described above, although the semiconductor memory device 100 according to some embodiments of the present disclosure has a structure other than the 2-bank structure, the semiconductor memory device 100 may satisfy the package, the capacity, and the operating condition required for the semiconductor memory device 100 regardless of the number or the size of the physical banks PBK1 through PBKp.

Figure 16:
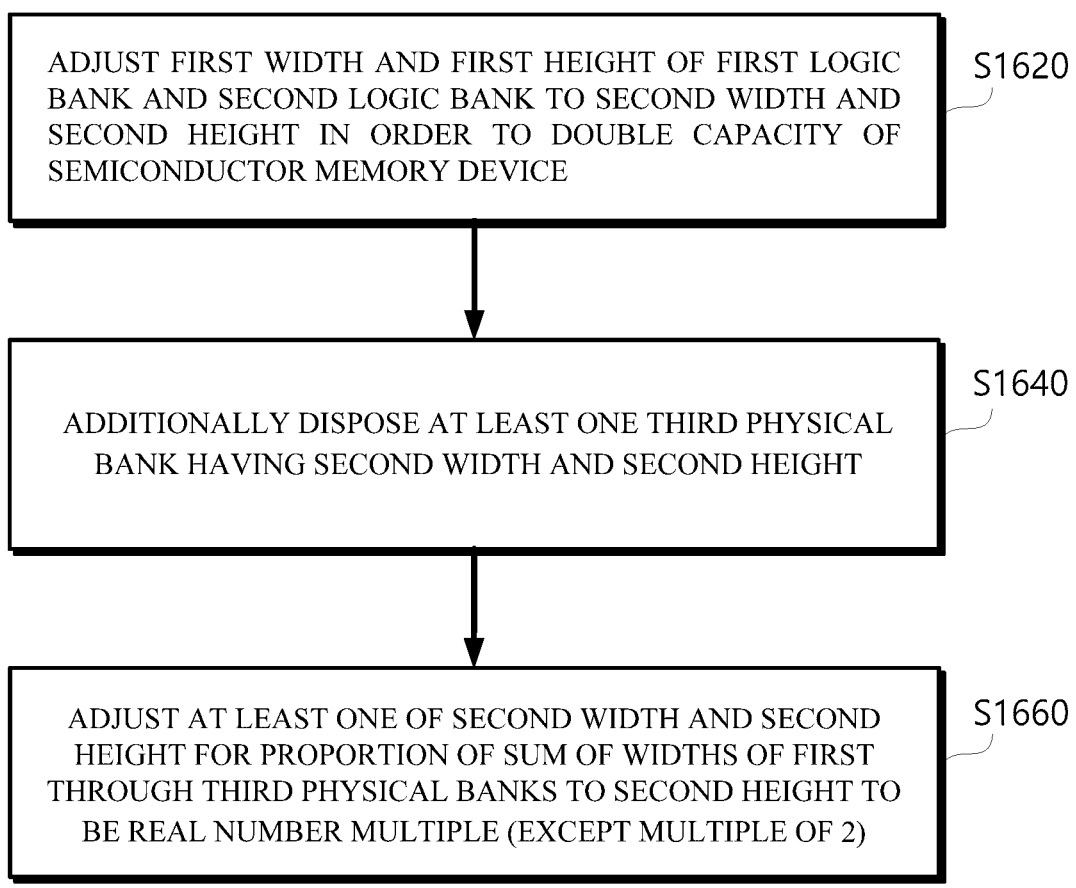
FIGS. 16 and 17 respectively illustrate a method of designing a semiconductor memory device according to some embodiments of the present disclosure.
Figure 17:
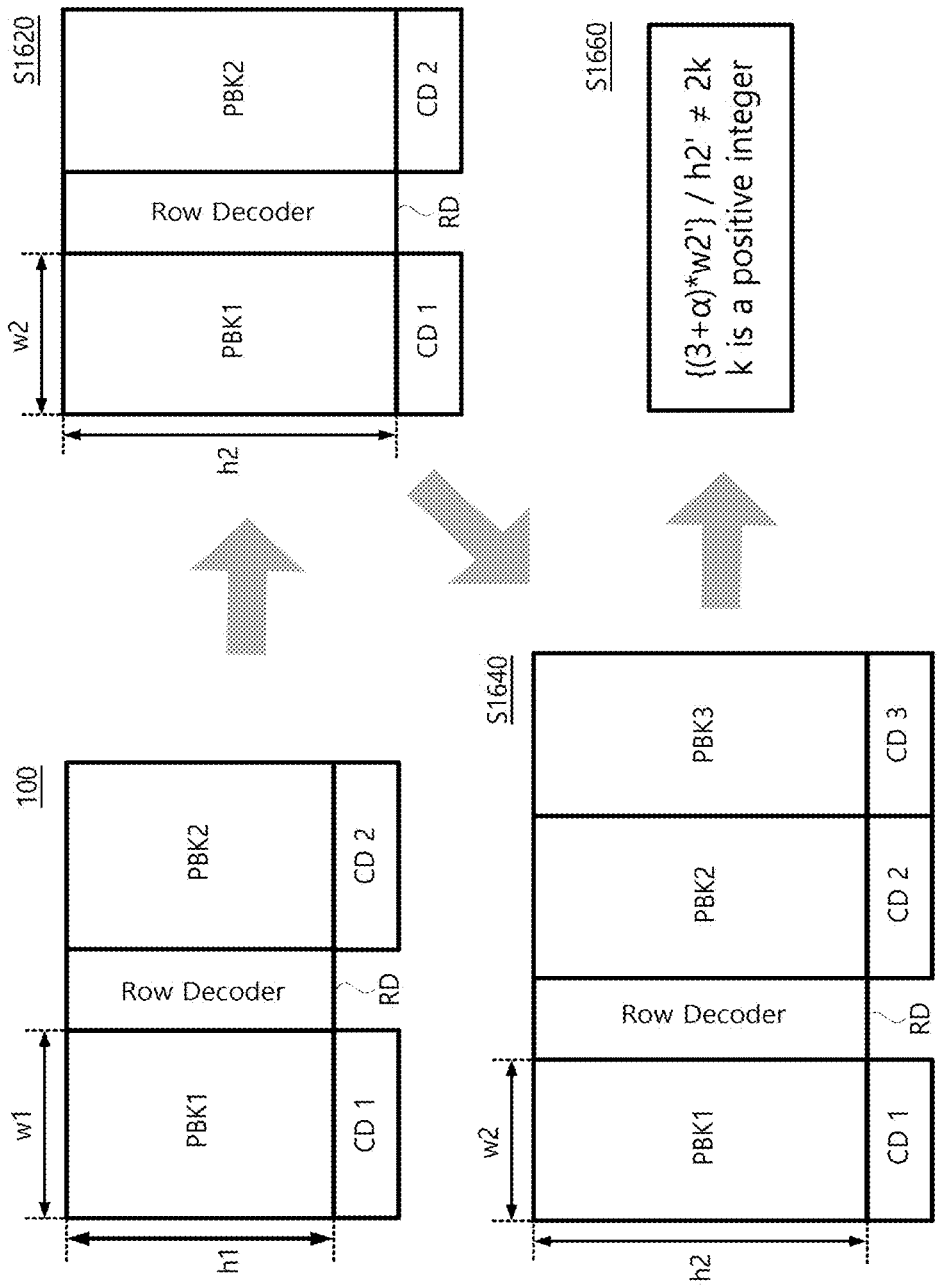

FIGS. 16 and 17 respectively illustrate a method 1600 of designing the semiconductor memory device 100 according to some embodiments of the present disclosure.

Referring to FIGS. 16 and 17, the method 1600 of designing the semiconductor memory device 100 according to some embodiments of the present disclosure is to increase the sum of the capacity of the first physical bank PBK1 and the second physical bank PBK2 by a multiple of 2 in the semiconductor memory device 100 including the first physical bank PBK1 and the second physical bank PBK2, each of which has the first width w1 and the first height h1 and is disposed in a row direction.

In this regard, the method 1600 of designing the semiconductor memory device 100 according to some embodiments of the present disclosure may include adjusting the first width w1 to a second width w2 and the first height h1 to a second height h2 in operation S1620, additionally disposing at least one third physical bank PBK3 (also referred to as at least one other physical bank PBK3) having the second width w2 and the second height h2 in a row direction in operation S1640, and adjusting at least one of the second width w2 or the second height h2 for the proportion of the sum 3*w2 of the respective second widths w2 of the first physical bank PBK1 through the third physical bank PBK3 to the second height h2 to be a real number multiple, instead of a multiple of 2 (e.g., that is not a multiple of 2), in operation S1660.

The second width w2 may be smaller or less than the first width w1 and the second height h2 may be longer or greater than the first height h1. The adjusting of at least one of the second width w2 or the second height h2 in operation S1660 may be performed in consideration of the capacity and the size of the package to be increased in the semiconductor memory device 100. Here, in order to adjust the second width w2, the third physical bank PBK3 may be added or removed.

FIG. 17 illustrates that the semiconductor memory device 100 includes 2 physical banks PBK1 and PBK2 before the method 1600 is performed according to some embodiments of the present disclosure, however, the present disclosure is not limited thereto. In the method 1600 according to some embodiments of the present disclosure, operations S1620 through S1660 may be performed for a plurality of physical banks PBK3 through PBK3n of FIG. 1A. In the additionally disposing of the third physical bank PBK3 in operation S1640, only one third physical bank PBK3 is added in FIG. 17, however, the present disclosure is not limited thereto. For example, a plurality of physical banks PBK3 through PBK3n of FIG. 1A may be added in operation S1640.

In addition, the method 1600 of designing the semiconductor memory device 100 according to some embodiments of the present disclosure may further include splitting the first physical bank PBK1 through the third physical bank PBK3 into at least two sub-banks and setting the sub-banks of at least one physical bank from among the first physical bank PBK1 through the third physical bank PBK3 to each different logic bank (refer to FIGS. 6 and/or 11). For example, the method 1600 of designing the semiconductor memory device 100 according to some embodiments of the present disclosure may further include splitting each of the first physical bank PBK1, the second physical bank PBK2, and the third physical bank PBK3 into at least two sub-banks and setting the at least two sub-banks of at least one of the first physical bank PBK1, the second physical bank PBK2, or the third physical bank PBK3 to be respectively included in different logic banks. For example, a first one of the at least two sub-banks may be included in the first logic bank LBK1 and a second one of the at least two sub-banks may be included in the second logic bank LBK2 (see FIGS. 6 and/or 11). Here, when an access to the sub-banks included in each different logic bank such as the (2-1)-th sub-bank PBK21 and the (2-2)-th sub-bank PBK22 of FIG. 11 is performed, the global input and output line GLN may be shared at a first time interval (for example, tCCD_L of FIG. 10).

In the method 1600 of designing the semiconductor memory device 100 according to some embodiments of the present disclosure described above, the semiconductor memory device 100 which may satisfy the package, the capacity, and the operating condition may be designed regardless of the number or the size of the physical banks PBK1 through PBK3.

In the semiconductor memory device and the method of designing the same according to some embodiments of the present disclosure, the physical banks are split and combined to be set as the logic banks. Accordingly, although an increase in the capacity of the physical banks is limited, the capacity of the banks may be expanded adaptively to a size of the package while the operating condition required for the semiconductor memory device is satisfied.

As used herein, the terms "comprises", "comprising", "includes", "including", "has", "having" and any other variations thereof specify the presence of the stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Although representative embodiments of the present disclosure have been described in detail, those of ordinary skill in the art to which the present disclosure pertains will understand that various modifications are capable of being made to the above-described embodiments without departing from the scope the present disclosure. Therefore, the scope of the present disclosure should not be limited to the described embodiments, and it should be defined by not only the claims described below but also any equivalents thereof.

What is claimed is:

1. A semiconductor memory device comprising n physical banks, each of which is configured to be entirely or partially included in one of a first logic bank or a second logic bank and arranged in a row direction, wherein n is an integer that is greater than or equal to 3, and wherein a proportion of a sum of respective widths of the n physical banks in the row direction to a height of the n physical banks in a column direction is a real number multiple that is not a multiple of 2.

2. The semiconductor memory device of claim 1, further comprising:
    a first row decoder configured to activate a word line of the first logic bank; and
    a second row decoder configured to activate a word line of the second logic bank.

3. The semiconductor memory device of claim 2, wherein the first row decoder is shared by a first word line through an ith word line from word lines of the n physical banks and the second row decoder is shared by remaining word lines from the word lines of the n physical banks other than the first word line through the ith word line, and
    wherein i is an integer that is greater than or equal to 2.

4. The semiconductor memory device of claim 2, wherein the first row decoder and the second row decoder are between two physical banks adjacent to each other in the row direction from the n physical banks.

5. The semiconductor memory device of claim 2, wherein at least one physical bank from the n physical banks is entirely included in the first logic bank, at least one physical bank from the n physical banks is entirely included in the second logic bank, and at least one physical bank from the n physical banks is partially included in the first and second logic banks,
    wherein the first row decoder is configured to activate 2i word lines of the at least one physical bank that is entirely included in the first logic bank and a first word line through an ith word line of the at least one physical bank that is partially included in the first and second logic banks,
    wherein the second row decoder is configured to activate 2i word lines of the at least one physical bank that is entirely included in the second logic bank and an i+1th word line through a 2ith word line of the at least one physical bank that is partially included in the first and second logic banks, and
    wherein i is an integer that is greater than or equal to 2.

6. The semiconductor memory device of claim 2, wherein the first row decoder and the second row decoder are spaced apart from each other with at least one physical bank from the n physical banks therebetween.

7. The semiconductor memory device of claim 2, wherein the first row decoder and the second row decoder are on a substrate different from that of the n physical banks.

8. The semiconductor memory device of claim 1, wherein each of the n physical banks is partially included in both the first logic bank and the second logic bank.

9. The semiconductor memory device of claim 8, wherein global input and output lines of the n physical banks are each shared by the first logic bank and the second logic bank.

10. The semiconductor memory device of claim 8, wherein the first logic bank and the second logic bank are configured to be activated in response to a row address.

11. The semiconductor memory device of claim 1, wherein at least one physical bank from the n physical banks is entirely included in the first logic bank,
    wherein at least one physical bank from the n physical banks is entirely included in the second logic bank, and
    wherein remaining physical banks from the n physical banks other than the at least one physical bank entirely included in the first logic bank and the at least one physical bank entirely included in the second logic bank are partially included in both the first logic bank and the second logic bank.

12. The semiconductor memory device of claim 11, wherein a global input and output line for the remaining physical banks from the n physical banks is shared by the first logic bank and the second logic bank.

13. The semiconductor memory device of claim 1, further comprising a plurality of bank groups that each comprise a pair of the n physical banks, wherein the pair of the n physical banks are symmetric with each other about a line that extends between respective first peripheral circuit regions of the pair of n physical banks, and wherein the respective first peripheral circuit regions are adjacent to each other in the column direction.

14. The semiconductor memory device of claim 1, wherein a number of the n physical banks is an odd number and each of the n physical banks has a same size.

15. A method of designing a semiconductor memory device comprising:
    adjusting a first width of first and second physical banks to a second width, respectively, and a first height of the first and second physical banks to a second height, respectively, the first and second physical banks being adjacent to each other in a row direction;
    providing at least one other physical bank in the row direction having the second width and the second height; and
    adjusting at least one of the second width or the second height such that a proportion of a sum of the second width of the first physical bank, the second physical bank, and the other physical bank to the second height is a real number multiple that is not a multiple of 2, thereby increasing a sum of a capacity of the first and second physical banks by a multiple of 2.

16. The method of claim 15, further comprising:
    splitting each of the first physical bank, the second physical bank, and the other physical bank into at least two sub-banks; and
    setting the at least two sub-banks of at least one of the first physical bank, the second physical bank, or the other physical bank to be respectively included in different logic banks.

17. The method of claim 16, further comprising sharing a global input and output line at a first time interval to access the at least two sub-banks respectively included in the different logic banks.

18. A semiconductor memory device comprising:
p physical banks that each include at least two sub-banks;
p column decoders each electrically connected to a corresponding physical bank from the p physical banks through a global input and output line, wherein a number of the p column decoders is equal to a number of the p physical banks; and
q row decoders each configured to activate one or more word lines of a corresponding logic bank from q logic banks,
wherein each of the p physical banks is configured to be entirely or partially included in one of the q logic banks, and
wherein p is a positive integer that is odd, and q is a positive integer that is greater than or equal to 2 but less than p.

19. The semiconductor memory device of claim 18, wherein ones of the at least two sub-banks included in each of the p physical banks that are at a same position along a row direction are included in a same logic bank from the q logic banks.

20. The semiconductor memory device of claim 18, wherein a proportion of a sum of respective widths of the p physical banks in a row direction to a height of the p physical banks in a column direction is a real number multiple that is not a multiple of 2.

* * * * *